US012738923B2

(12) United States Patent
Takahashi et al.

(10) Patent No.: US 12,738,923 B2
(45) Date of Patent: Sep. 15, 2026

(54) RADIO FREQUENCY MODULE AND COMMUNICATION DEVICE

(71) Applicant: Murata Manufacturing Co., Ltd., Nagaokakyo (JP)

(72) Inventors: Hidetaka Takahashi, Nagaokakyo (JP); Takanori Ito, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 196 days.

(21) Appl. No.: 18/888,185

(22) Filed: Sep. 18, 2024

(65) Prior Publication Data

US 2025/0015782 A1 Jan. 9, 2025

Related U.S. Application Data

(63) Continuation of application No. PCT/JP2023/014388, filed on Apr. 7, 2023.

(30) Foreign Application Priority Data

Apr. 12, 2022 (JP) ................................ 2022-065869

(51) Int. Cl.
*H03H 9/54* (2006.01)
*H03H 9/13* (2006.01)
(Continued)

(52) U.S. Cl.
CPC .............. *H03H 9/54* (2013.01); *H03H 9/133* (2013.01); *H03H 9/205* (2013.01); *H05K 1/181* (2013.01); *H05K 2201/1006* (2013.01)

(58) Field of Classification Search
CPC .. H05K 1/181; H05K 2201/1006; H03H 9/54; H03H 9/133; H03H 9/205
See application file for complete search history.

(56) References Cited

U.S. PATENT DOCUMENTS 11,005,444 B2 * 5/2021 Hatsuda .................. H03F 3/195
2016/0142040 A1 * 5/2016 Yasuda .................... H03H 9/08 333/133
(Continued)

FOREIGN PATENT DOCUMENTS

JP 2007-110202 A 4/2007
JP 2019-114985 A 7/2019
(Continued)

OTHER PUBLICATIONS

International Search Report and Written Opinion mailed on Jun. 13, 2023, received for International Application No. PCT/JP2023/014388, filed on Apr. 7, 2023, 08 pages including English Translation.

*Primary Examiner* — Paresh Paghadal
(74) *Attorney, Agent, or Firm* — XSENSUS LLP

(57) ABSTRACT

A radio frequency module including a mounting board, a first acoustic wave filter, a second acoustic wave filter, and a shield electrode. The second acoustic wave filter is disposed on the first acoustic wave filter. The first acoustic wave filter supports a first communication band, and the second acoustic wave filter supports a second communication band. The first acoustic wave filter includes a first support member and a first functional electrode. The second acoustic wave filter includes a second support member and a second functional electrode. The first functional electrode and the second functional electrode are located in a hollow space formed between the first support member and the second support member in a thickness direction of the mounting board, and face each other. The shield electrode is located in the hollow space and covers at least one of the first functional electrode and the second functional electrode.

20 Claims, 6 Drawing Sheets

(51) Int. Cl.

| | |
|---|---|
| ***H03H 9/205*** | (2006.01) |
| ***H05K 1/181*** | (2026.01) |

(56) References Cited

U.S. PATENT DOCUMENTS

| | | | | |
|---|---|---|---|---|
| 2019/0097599 | A1* | 3/2019 | Taniguchi | H03H 9/02086 |
| 2019/0199324 | A1* | 6/2019 | Matsumoto | H03H 9/0547 |
| 2021/0297108 | A1* | 9/2021 | Matsumoto | H04B 1/0057 |
| 2021/0376811 | A1* | 12/2021 | Koreeda | H03H 9/1085 |
| 2021/0399699 | A1* | 12/2021 | Hanaoka | H03F 3/195 |

FOREIGN PATENT DOCUMENTS

| | | | |
|---|---|---|---|
| JP | 2020-145596 | A | 9/2020 |
| WO | 2021/002296 | A1 | 1/2021 |
| WO | 2021/215107 | A1 | 10/2021 |
| WO | 2022/009976 | A1 | 1/2022 |

* cited by examiner 51a
68
12
11
4
661
612A
671
672
69
612B(121)
SP0
SP1
SP2
643A
644A
646A
645A
645B
646B
644B
643B
611A
611B
662
61B
61A
41
42
D1

RADIO FREQUENCY MODULE AND COMMUNICATION DEVICE

CROSS REFERENCE TO RELATED APPLICATIONS

This is a continuation application of PCT/JP2023/014388, filed on Apr. 7, 2023, designating the United States of America, which is based on and claims priority to Japanese Patent Application No. JP 2022-065869 filed on Apr. 12, 2022. The entire contents of the above-identified applications, including the specifications, drawings and claims, are incorporated herein by reference in their entirety.

TECHNICAL FIELD

The present disclosure generally relates to a radio frequency module and a communication device, and more particularly relates to a radio frequency module including a plurality of filters and a communication device including the radio frequency module.

BACKGROUND ART

Patent Document 1 discloses a structure including two acoustic wave devices. In the structure described in Patent Document 1, IDT electrodes of the two acoustic wave devices face each other.

CITATION LIST

Patent Document

Patent Document 1: Japanese Unexamined Patent Application Publication No. 2019-114985

SUMMARY OF DISCLOSURE

Technical Problem

However, in the structure described in Patent Document 1, in a case where two acoustic wave devices are used as acoustic wave filters (first acoustic wave filter and second acoustic wave filter), interference may occur between a first signal passing through the first acoustic wave filter and a second signal passing through the second acoustic wave filter. In particular, in a case where the first signal is a transmission signal and the second signal is a reception signal, or in a case where the first signal is a reception signal and the second signal is a transmission signal, the difference in signal strength between the transmission signal and the reception signal is large, resulting in significant interference. Therefore, it may be difficult to improve isolation between the first acoustic wave filter and the second acoustic wave filter.

An object of the present disclosure is to provide a radio frequency module and a communication device capable of improving isolation between a first acoustic wave filter and a second acoustic wave filter in a case where asynchronous communication is performed in TDD.

Solution to Problem

According to an aspect of the present disclosure, a radio frequency module includes a mounting board, a first acoustic wave filter, a second acoustic wave filter, and a first shield electrode. The mounting board has a first main surface and a second main surface facing each other. The first acoustic wave filter is disposed at the first main surface of the mounting board. The second acoustic wave filter is disposed on the first acoustic wave filter. The first acoustic wave filter supports transmission or reception in a first communication band for TDD. The second acoustic wave filter supports transmission or reception in a second communication band for TDD. A combination of the first acoustic wave filter and the second acoustic wave filter is a combination of a filter that supports transmission and a filter that supports reception. Asynchronous communication is able to be performed in the first communication band and the second communication band. The first acoustic wave filter includes a first support member and a first functional electrode. The first support member has a third main surface. The first functional electrode is provided at the third main surface of the first support member. The second acoustic wave filter includes a second support member and a second functional electrode. The second support member has a fourth main surface. The second functional electrode is provided at the fourth main surface of the second support member. The first functional electrode and the second functional electrode are located in a hollow space and face each other. The hollow space is formed between the first support member and the second support member in a thickness direction of the mounting board. The first shield electrode is located in the hollow space and covers at least one of the first functional electrode and the second functional electrode.

According to an aspect of the present disclosure, a communication device includes the radio frequency module and a signal processing circuit. The signal processing circuit is connected to the radio frequency module.

Advantageous Effects of Disclosure

With the radio frequency module and the communication device according to the aspects of the present disclosure, it is possible to improve the isolation between the first acoustic wave filter and the second acoustic wave filter in a case where asynchronous communication is performed in TDD.

DESCRIPTION OF EMBODIMENTS

Figure 1:
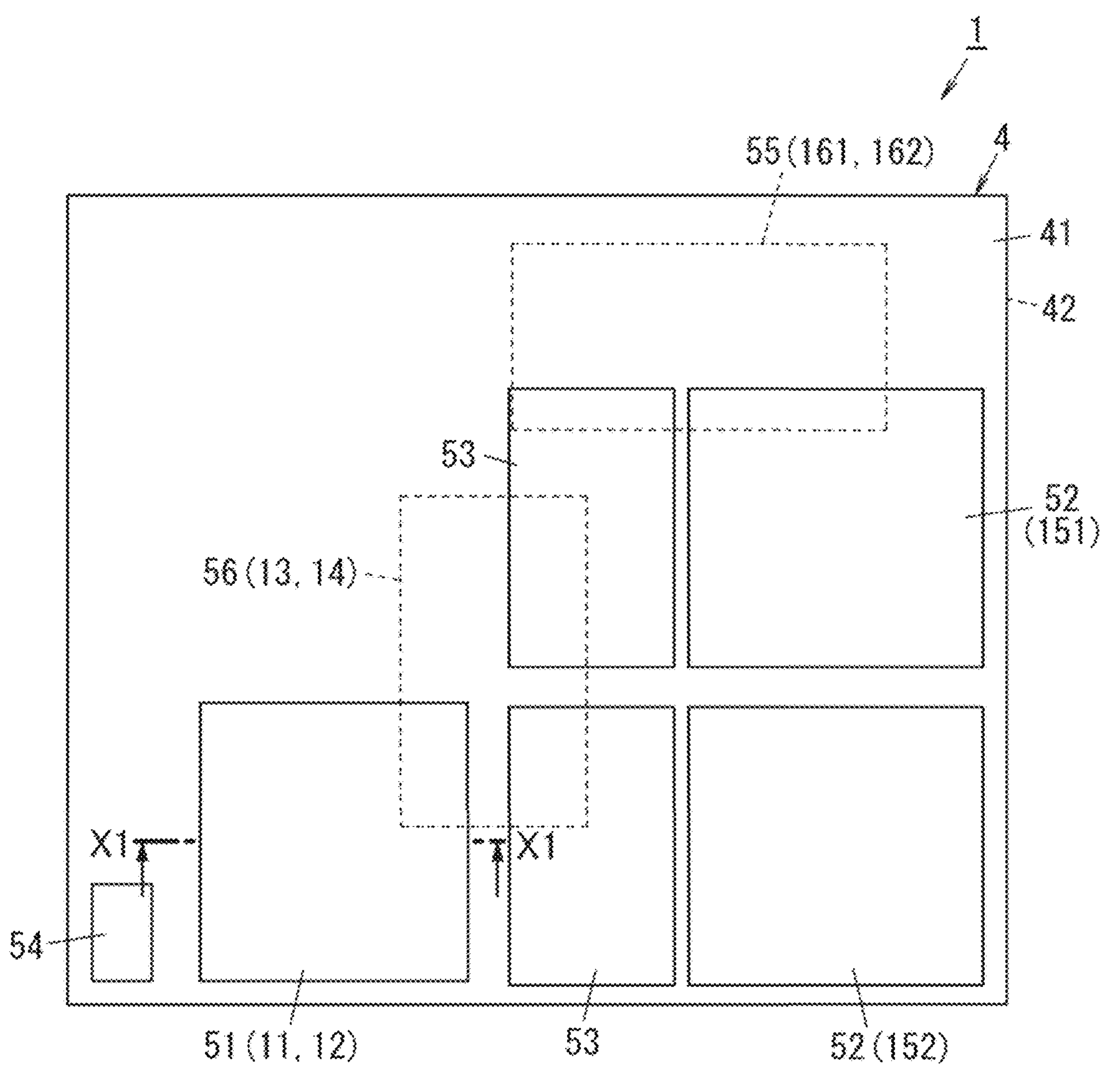
FIG. 1 is a plan view of a radio frequency module according to Embodiment 1.

Hereinafter, radio frequency modules and communication devices according to Embodiments 1 to 3 will be described with reference to the drawings. The drawings referred to in Embodiments 1 to 3 as follows are all schematic drawings, and the ratios of the respective sizes and thicknesses of the constituent elements in the drawings do not necessarily reflect the actual dimensional ratios.

Embodiment 1

First, a configuration of a radio frequency module 1 according to Embodiment 1 will be described with reference to the drawings.

(1) Radio Frequency Module

Figure 3:
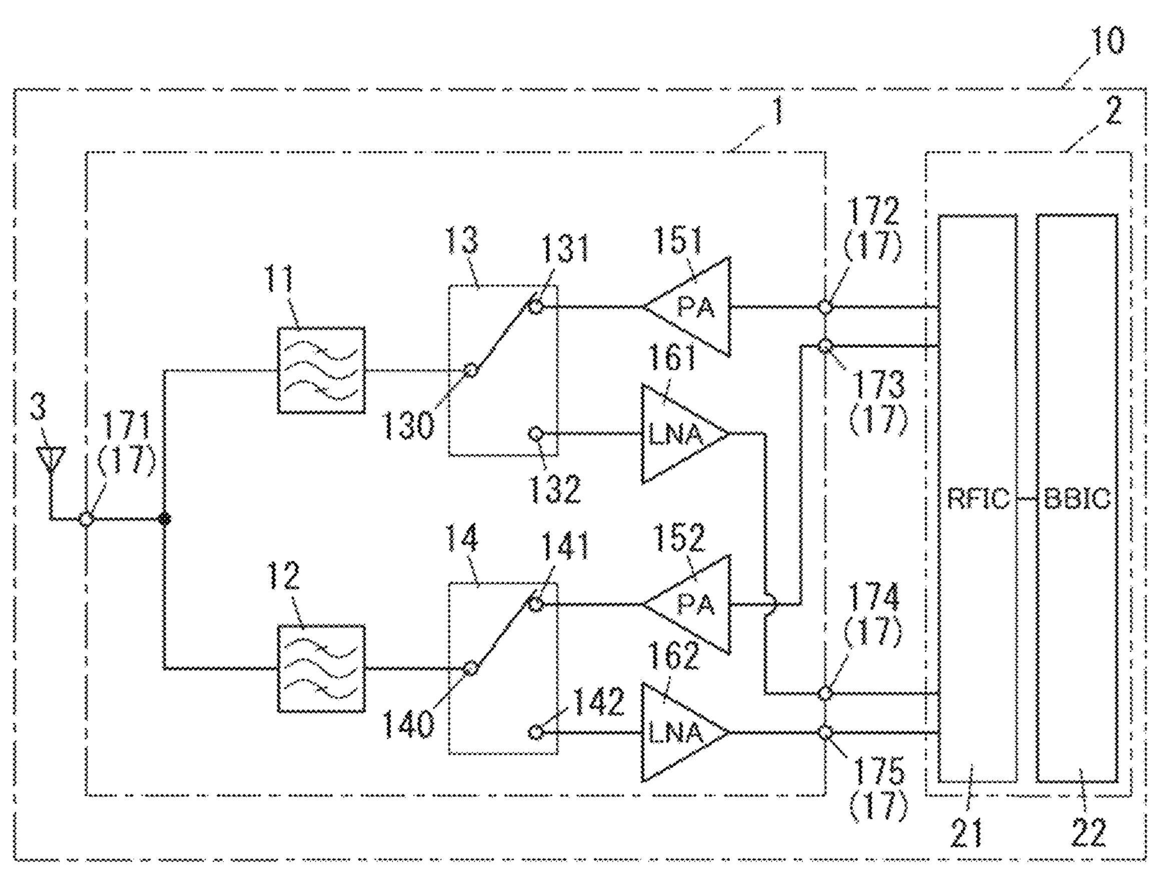
FIG. 3 is a circuit configuration diagram of a communication device including the radio frequency module.

A radio frequency module 1 is used, for example, in a communication device 10 as shown in FIG. 3. For example, the communication device 10 is a mobile phone such as a smartphone. The communication device 10 is not limited to the mobile phone, and may be a wearable terminal such as a smart watch, for example. The radio frequency module 1 is, for example, a module capable of supporting the fourth generation mobile communication (4G) standard, the fifth generation communication (5G) standard, and the like. For example, the 4G standard is the third generation partnership project (3GPP: registered trademark) long term evolution (LTE: registered trademark) standard. The 5G standard is, for example, the 5G new radio (NR).

The radio frequency module 1 is, for example, a module capable of supporting carrier aggregation and dual connectivity. Carrier aggregation and dual connectivity refer to a technology used for communication that uses radio waves in a plurality of frequency bands at the same time.

The communication device 10 performs communication in a plurality of communication bands. More specifically, the communication device 10 transmits a transmission signal in each of a plurality of communication bands and receives a reception signal in each of the plurality of communication bands. Specifically, the radio frequency module 1 receives a reception signal in a first communication band and a reception signal in a second communication band. In addition, the radio frequency module 1 transmits a transmission signal in the first communication band and a transmission signal in the second communication band.

The transmission signal and the reception signal in the first communication band are time division duplex (TDD) signals. In addition, a transmission signal and a reception signal in the second communication band are TDD signals. The TDD is a radio communication technology in which the same frequency band is allocated to transmission and reception in radio communication, and transmission and reception are switched by the hour.

In addition, communication in the first communication band and communication in the second band are asynchronous communication. More specifically, the transmittable periods of the first communication band and the second communication band do not necessarily coincide with each other. In addition, the receivable periods of the first communication band and the second communication band do not necessarily coincide with each other. That is, a transmission signal in the second communication band may be transmitted simultaneously with transmission of a transmission signal in the first communication band, and a reception signal in the second communication band may be received simultaneously with transmission of a transmission signal in the first communication band. Similarly, a reception signal in the second communication band may be received simultaneously with reception of a reception signal in the first communication band, and a transmission signal in the second communication band may be transmitted simultaneously with reception of a reception signal in the first communication band.

The first communication band is, for example, Band 39 of the 3GPP LTE standard. In addition, the second communication band is, for example, Band 41 of the 3GPP LTE standard. A transmission signal of Band 39 is a signal of the power class 3, and a transmission signal of Band 41 is a signal of the power class 2. The signal of the power class 2 has a signal strength higher than the signal of the power class 3. That is, the signal strength of the transmission signal in the second communication band is higher than the communication strength of the transmission signal in the first communication band.

(2) Circuit Configuration of Radio Frequency Module

Next, a circuit configuration of the radio frequency module 1 according to Embodiment 1 will be described with reference to FIG. 3.

As shown in FIG. 3, the radio frequency module 1 according to Embodiment 1 includes a first filter 11 and a second filter 12. In addition, the radio frequency module 1 according to Embodiment 1 further includes a first switch 13 and a second switch 14. In addition, the radio frequency module according to Embodiment 1 further includes a power amplifier 151, a power amplifier 152, a low-noise amplifier 161, and a low-noise amplifier 162. Further, the radio frequency module 1 according to Embodiment 1 further includes a plurality of (five in the shown example) external connection terminals 17. The plurality of external connection terminals 17 include an antenna terminal 171, a first input terminal 172, a second input terminal 173, a first output terminal 174, and a second output terminal 175.

(2.1) First Filter, Second Filter

The first filter 11 and the second filter 12 are filters that cause signals in frequency bands different from each other to pass therethrough. More specifically, the first filter 11 is a filter that causes a transmission signal and a reception signal in the first communication band to pass through the first filter 11. The second filter 12 is a filter that causes a transmission signal and a reception signal in the second communication band to pass through the second filter 12.

As will be described later, each of the first filter 11 and the second filter 12 is an acoustic wave filter having one or more acoustic wave resonators. That is, in the present embodiment, the first filter 11 is a first acoustic wave filter. In addition, in the present embodiment, the second filter 12 is a second acoustic wave filter. The first filter 11 and the second filter 12 are included in a single electronic component, as will be described later.

(2.2) First Switch

As shown in FIG. 3, the first switch 13 is a switch for switching a path connected to the first filter 11 from among the power amplifier 151 and the low-noise amplifier 161. That is, the first switch 13 is a switch for switching a path to be connected to the first filter 11. The first switch 13 has a common terminal 130 and a plurality of (two in the shown example) selection terminals 131 and 132.

The common terminal 130 is connected to the first filter 11. The selection terminal 131 is connected to the power amplifier 151. In addition, the selection terminal 132 is connected to the low-noise amplifier 161.

The first switch 13 switches the connection between the common terminal 130 and the plurality of selection terminals 131 and 132. The first switch 13 is controlled by, for example, the signal processing circuit 2. The first switch 13 electrically connects the common terminal 130 to any one of the plurality of selection terminals 131 and 132 in accordance with a control signal from an RF signal processing circuit 21 of the signal processing circuit 2.

(2.3) Second Switch

As shown in FIG. 3, the second switch 14 is a switch for switching a path connected to the second filter 12 from among the power amplifier 152 and the low-noise amplifier 162. That is, the second switch 14 is a switch for switching a path to be connected to the second filter 12. The second switch 14 has a common terminal 140 and a plurality of (two in the shown example) selection terminals 141 and 142.

The common terminal 140 is connected to the second filter 12. The selection terminal 141 is connected to the power amplifier 152. In addition, the selection terminal 142 is connected to the low-noise amplifier 162.

The second switch 14 switches the connection between the common terminal 140 and the plurality of selection terminals 141 and 142. The second switch 14 is controlled by, for example, the signal processing circuit 2. The second switch 14 electrically connects the common terminal 140 to any one of the plurality of selection terminals 141 and 142 in accordance with a control signal from the RF signal processing circuit 21 of the signal processing circuit 2.

(2.4) Power Amplifier

The power amplifier 151 is an amplifier that amplifies a transmission signal. More specifically, the power amplifier 151 amplifies a transmission signal in the first communication band. The power amplifier 151 is provided between the selection terminal 131 of the first switch 13 and the first input terminal 172. The power amplifier 151 includes an input terminal (not shown) and an output terminal (not shown). The input terminal of the power amplifier 151 is connected to an external circuit (for example, the signal processing circuit 2) with the first input terminal 172 interposed therebetween. The output terminal of the power amplifier 151 is connected to the selection terminal 131 of the first switch 13. The power amplifier 151 is controlled by, for example, a controller (not shown).

The power amplifier 152 is an amplifier that amplifies a transmission signal. More specifically, the power amplifier 152 amplifies a transmission signal in the second communication band. The power amplifier 152 is provided between the selection terminal 142 of the second switch 14 and the second input terminal 173. The power amplifier 152 includes an input terminal (not shown) and an output terminal (not shown). The input terminal of the power amplifier 152 is connected to the external circuit (for example, the signal processing circuit 2) with the second input terminal 173 interposed therebetween. The output terminal of power amplifier 152 is connected to the selection terminal 142 of the second switch 14. The power amplifier 152 is controlled by, for example, a controller (not shown).

(2.5) Low-Noise Amplifier

The low-noise amplifier 161 is an amplifier that amplifies a reception signal with a low noise. More specifically, the low-noise amplifier 161 amplifies a reception signal in the first communication band. The low-noise amplifier 161 is provided between the selection terminal 132 of the first switch 13 and the first output terminal 174. The low-noise amplifier 161 includes an input terminal (not shown) and an output terminal (not shown). The input terminal of the low-noise amplifier 161 is connected to the selection terminal 132 of the first switch 13. The output terminal of the low-noise amplifier 161 is connected to the external circuit (for example, the signal processing circuit 2) with the first output terminal 174 interposed therebetween.

The low-noise amplifier 162 is an amplifier that amplifies a reception signal with a low noise. More specifically, the low-noise amplifier 162 amplifies a reception signal in the second communication band. The low-noise amplifier 162 is provided between the selection terminal 142 of the second switch 14 and the second output terminal 175. The low-noise amplifier 162 includes an input terminal (not shown) and an output terminal (not shown). The input terminal of the low-noise amplifier 162 is connected to the selection terminal 142 of the second switch 14. The output terminal of the low-noise amplifier 162 is connected to the external circuit (for example, the signal processing circuit 2) with the second output terminal 175 interposed therebetween.

(2.6) External Connection Terminal

The plurality of external connection terminals 17 are terminals for electrical connection to an external circuit (for example, the signal processing circuit 2). The plurality of external connection terminals 17 include an antenna terminal 171, a first input terminal 172, a second input terminal 173, a first output terminal 174, a second output terminal 175, a plurality of control terminals (not shown), and a plurality of ground terminals (not shown).

The antenna terminal 171 is connected to an antenna 3. In the radio frequency module 1, the antenna terminal 171 is connected to the first filter 11 and the second filter 12.

The first input terminal 172 is a terminal for inputting a transmission signal from the external circuit (for example, the signal processing circuit 2) to the radio frequency module 1. More specifically, the first input terminal 172 receives an input of a transmission signal in the first communication band. In the radio frequency module 1, the first input terminal 172 is connected to the input terminal of the power amplifier 151.

The second input terminal 173 is a terminal for inputting a transmission signal from the external circuit (for example, the signal processing circuit 2) to the radio frequency module 1. More specifically, the second input terminal 173 receives an input of a transmission signal in the second communication band. In the radio frequency module 1, the second input terminal 173 is connected to the input terminal of the power amplifier 152.

The first output terminal 174 is a terminal for outputting a reception signal from the radio frequency module 1 to the external circuit (for example, the signal processing circuit 2). More specifically, the first output terminal 174 outputs a reception signal in the first communication band. In the radio frequency module 1, the first output terminal 174 is connected to the output terminal of the low-noise amplifier 161.

The second output terminal 175 is a terminal for outputting a reception signal from the radio frequency module 1 to the external circuit (for example, the signal processing circuit 2). More specifically, the second output terminal 175 outputs a reception signal in the second communication band. In the radio frequency module 1, the second output terminal 175 is connected to the output terminal of the low-noise amplifier 162.

The plurality of ground terminals are terminals that are electrically connected to a ground electrode of an external board (not shown) included in the communication device 10, and to which a ground potential is applied. In the radio frequency module 1, the plurality of ground terminals are connected to a ground layer (not shown) of the mounting board 4 (see FIG. 1). The ground layer is a circuit ground of the radio frequency module 1.

(3) Structure of Radio Frequency Module

Next, a structure of the radio frequency module 1 according to Embodiment 1 will be described with reference to FIGS. 1 and 2.

Figure 2:
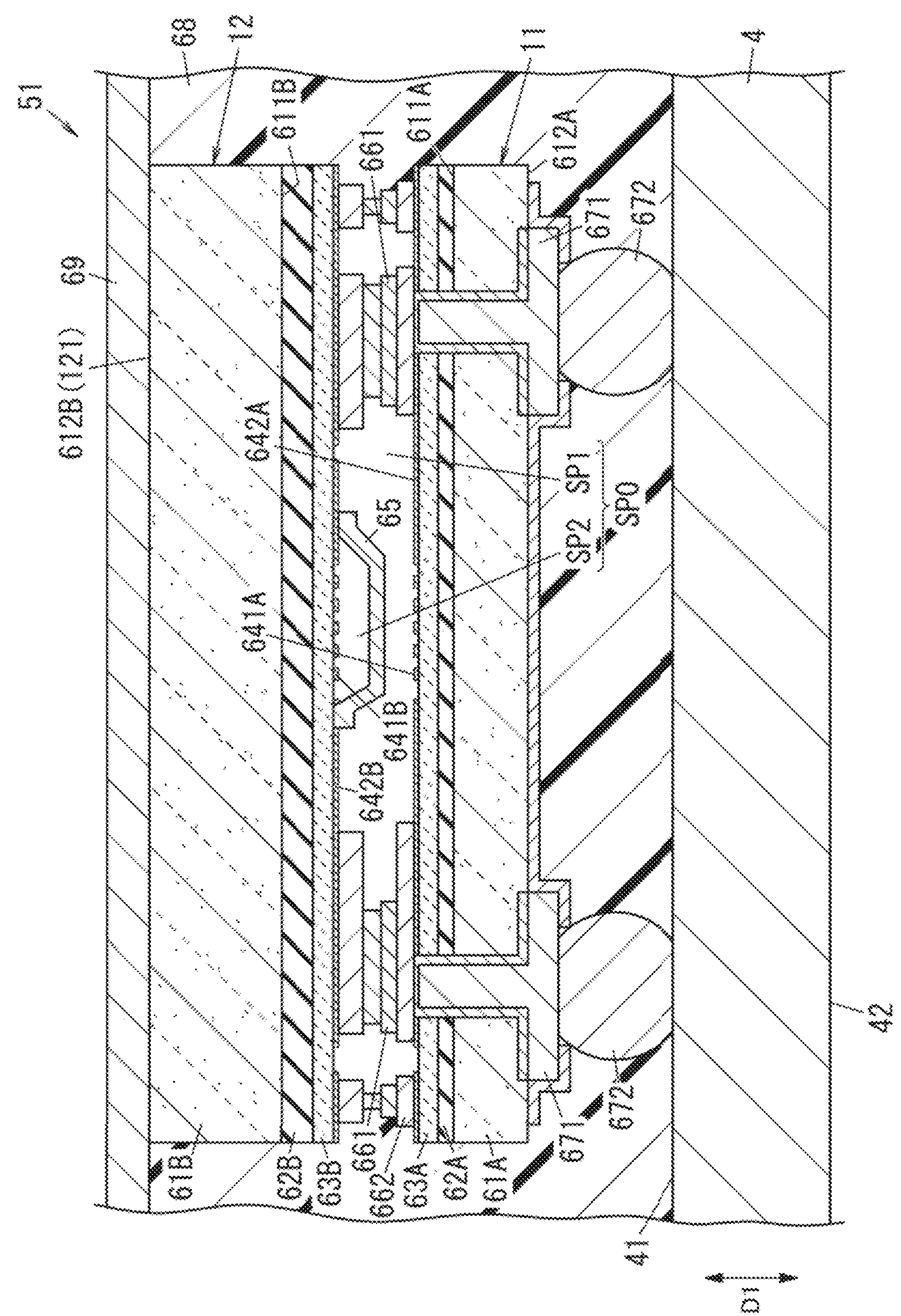
FIG. 2 is a cross-sectional view taken along line X1-X1 in FIG. 1, related to the radio frequency module.

As shown in FIGS. 1 and 2, the radio frequency module 1 includes the mounting board 4, a first electronic component 51, a plurality of (two in the shown example) second electronic components 52, a plurality of (two in the shown example) third electronic components 53, a fourth electronic component 54, a fifth electronic component 55, and a sixth electronic component 56. In addition, as shown in FIG. 2, the radio frequency module 1 further includes a resin layer 68 and a second shield electrode 69.

The radio frequency module 1 is electrically connected to an external board (not shown). The external board is, for example, a mother board of the communication device 10 (see FIG. 3) that is a mobile phone, a communication device, or the like, for example.

(3.1) Mounting Board

As shown in FIGS. 1 and 2, the mounting board 4 has a first main surface 41 and a second main surface 42. The first main surface 41 and the second main surface 42 face each other in a thickness direction D1 (see FIG. 2) (also referred to as a "first direction D1" below) of the mounting board 4. In a case where the radio frequency module 1 is provided at an external board, the second main surface 42 faces a main surface of the external board on the mounting board 4 side. The mounting board 4 is a double-sided mounting board in which the first electronic component 51, the second electronic component 52, the third electronic component 53, and the fourth electronic component 54 are mounted on the first main surface 41, and the fifth electronic component 55 and the sixth electronic component 56 are mounted on the second main surface 42.

The mounting board 4 is a multilayer substrate in which a plurality of dielectric layers are laminated. The mounting board 4 has a plurality of conductive layers and a plurality of via conductors (including through-electrodes). The plurality of conductive layers include the ground layer at the ground potential. The plurality of via conductors are used for electrical connection between the elements (including the first electronic component 51, the second electronic component 52, the third electronic component 53, the fourth electronic component 54, the fifth electronic component 55, and the sixth electronic component 56 described above) mounted on both the first main surface 41 and the second main surface 42 and the conductive layers of the mounting board 4.

(3.2) First Electronic Component

As shown in FIGS. 1 and 2, the first electronic component 51 is disposed at the first main surface 41 of the mounting board 4. The first electronic component 51 includes the first filter 11 and the second filter 12.

Each of the first filter 11 and the second filter 12 is, for example, an acoustic wave filter that includes a plurality of series arm resonators and a plurality of parallel arm resonators. For example, the acoustic wave filter is a surface acoustic wave (SAW) filter using a surface acoustic wave. Further, each of the first filter 11 and the second filter 12 may include at least one of an inductor and a capacitor connected in series to any of the plurality of series arm resonators. In addition, each of the first filter 11 and the second filter 12 may include an inductor or a capacitor connected in series to any of the plurality of parallel arm resonators.

(3.3) Second Electronic Component

As shown in FIG. 1, each of the plurality of second electronic components 52 is disposed at the first main surface 41 of the mounting board 4. In the example in FIG. 1, each of the plurality of second electronic components 52 is mounted at the first main surface 41 of the mounting board 4. Some or all of the plurality of second electronic components 52 may be mounted at the second main surface 42 of the mounting board 4. The plurality of second electronic components 52 include, for example, the power amplifier 151 and the power amplifier 152.

(3.4) Third Electronic Component

As shown in FIG. 1, each of the third electronic components 53 is disposed at the first main surface 41 of the mounting board 4. The third electronic component 53 is mounted at the first main surface 41 of the mounting board 4. The third electronic component 53 is, for example, an inductor constituting a matching circuit (not shown) provided in a path between the selection terminal 131 of the first switch 13 and the power amplifier 151. The matching circuit is a circuit for performing impedance matching between the first filter 11 and the power amplifier 151. In addition, the third electronic component 53 is, for example, an inductor constituting a matching circuit (not shown) provided in a path between the selection terminal 141 of the second switch 14 and the power amplifier 152. The matching circuit is a circuit for performing impedance matching between the second filter 12 and the power amplifier 152. The inductor is, for example, a chip inductor.

(3.5) Fourth Electronic Component

As shown in FIG. 1, the fourth electronic component 54 is disposed at the first main surface 41 of the mounting board 4. The fourth electronic component 54 is mounted at the first main surface 41 of the mounting board 4. The fourth electronic component 54 is, for example, a capacitor constituting a matching circuit (not shown) provided in a path between the first filter 11 and the second filter 12, and the antenna terminal 171. The matching circuit is a circuit for performing impedance matching between the first filter 11 and the second filter 12, and the antenna 3.

(3.6) Fifth Electronic Component

As shown in FIG. 1, the fifth electronic component 55 is disposed at the second main surface 42 of the mounting board 4. The fifth electronic component 55 is mounted at the second main surface 42 of the mounting board 4. The fifth electronic component 55 includes a low-noise amplifier 161 and a low-noise amplifier 162.

(3.7) Sixth Electronic Component

As shown in FIG. 2, the sixth electronic component 56 is disposed at the second main surface 42 of the mounting board 4. More specifically, the sixth electronic component 56 is mounted at the second main surface 42 of the mounting board 4. The sixth electronic component 56 is an IC including the first switch 13 and the second switch 14. That is, in the present embodiment, the sixth electronic component 56 corresponds to an electronic component that is an IC including at least one of the first switch 13 and the second switch 14.

The sixth electronic component 56 overlaps the first electronic component 51 in a plan view from the first direction D1 that is the thickness direction of the mounting board 4.

(3.8) Resin Layer and Second Shield Electrode

The resin layer 68 (see FIG. 2) covers a side surface of the first electronic component 51 or the like. More specifically, the resin layer 68 covers at least a part of the first filter 11 and the second filter 12 in the first electronic component 51.

The second shield electrode 69 (see FIG. 2) covers a part of the resin layer 68. More specifically, the second shield electrode 69 is in contact with the main surface 121 (see FIG. 2) of the second filter 12 on an opposite side from the first filter 11 side, in the first electronic component 51.

(4) Detailed Structure of Each Constituent Element of Radio Frequency Module (4.1) Mounting Board The mounting board 4 shown in FIGS. 1 and 2 is, for example, a multilayer substrate including a plurality of dielectric layers and a plurality of conductive layers. The plurality of dielectric layers and the plurality of conductive layers are laminated in the thickness direction D1 of the mounting board 4. The plurality of conductive layers are formed in a predetermined pattern determined for each layer. Each of the plurality of conductive layers includes one or a plurality of conductor portions in one plane perpendicular to the thickness direction D1 of the mounting board 4. A material of each conductive layer is, for example, copper. The plurality of conductive layers include a ground layer. In the radio frequency module 1, the plurality of ground terminals and the ground layer are electrically connected to each other with the via conductor and the like of the mounting board 4 interposed therebetween. The mounting board 4 is, for example, a low temperature co-fired ceramics (LTCC) substrate. The mounting board 4 is not limited to the LTCC substrate, and may be, for example, a printed wiring board, a high temperature co-fired ceramics (HTCC) substrate, or a resin multilayer substrate.

Further, the mounting board 4 is not limited to the LTCC substrate, and may be, for example, a wiring structural body. The wiring structural body is, for example, a multilayer structural body. The multilayer structural body includes at least one insulating layer and at least one conductive layer. The insulating layer is formed in a predetermined pattern. In a case where a plurality of insulating layers are provided, the plurality of insulating layers are formed in a predetermined pattern determined for each layer. The conductive layer is formed in a predetermined pattern different from the predetermined pattern of the insulating layer. In a case where a plurality of conductive layers are provided, the plurality of conductive layers are formed in a predetermined pattern determined for each layer. The conductive layer may include one or a plurality of rewiring portions. In the wiring structural body, a first surface of two surfaces facing each other in the thickness direction of the multilayer structural body is the first main surface 41 of the mounting board 4, and a second surface is the second main surface 42 of the mounting board 4. The wiring structural body may be, for example, an interposer. The interposer may be an interposer using a silicon substrate or may be a substrate constituted by multiple layers.

The first main surface 41 and the second main surface 42 of the mounting board 4 are separated in the thickness direction D1 of the mounting board 4, and intersect with the thickness direction D1 of the mounting board 4. The first main surface 41 of the mounting board 4 is, for example, perpendicular to the thickness direction D1 of the mounting board 4, and may include, for example, a side surface or the like of the conductor portion as a surface that is not perpendicular to the thickness direction D1 of the mounting board 4. In addition, the second main surface 42 of the mounting board 4 is, for example, perpendicular to the thickness direction D1 of the mounting board 4, and may include, for example, a side surface or the like of the conductor portion as a surface that is not perpendicular to the thickness direction D1 of the mounting board 4. Further, the first main surface 41 and the second main surface 42 of the mounting board 4 may be formed with fine irregularities, recesses, or protrusions.

(4.2) First Electronic Component

A detailed structure of the first electronic component 51 shown in FIG. 2 will be described.

The first electronic component 51 includes the first filter 11 that is an acoustic wave filter, and the second filter 12 that is also an acoustic wave filter. As shown in FIG. 2, the first electronic component 51 includes a first substrate 61A, a first low acoustic velocity film 62A, a first piezoelectric layer 63A, and a first circuit portion 642A. The first substrate 61A includes a main surface 611A and a main surface 612A facing each other in a thickness direction of the first substrate 61A. The first circuit portion 642A includes a plurality of first interdigital transducer (IDT) electrodes 641A. In the present embodiment, the plurality of first IDT electrodes 641A are first functional electrodes. The first low acoustic velocity film 62A is provided on the main surface 611A of the first substrate 61A. That is, in the present embodiment, the first substrate 61A is the first support member. In addition, in the present embodiment, the main surface 611A of the first substrate 61A is referred to as a third main surface. The plurality of first IDT electrodes 641A are provided on the first piezoelectric layer 63A. The first filter 11 includes the first substrate 61A, the first low acoustic velocity film 62A, the first piezoelectric layer 63A, the plurality of first IDT electrodes 641A, and the first circuit portion 642A.

As shown in FIG. 2, the first electronic component 51 further includes a second substrate 61B, a second low acoustic velocity film 62B, a second piezoelectric layer 63B, and a second circuit portion 642B. The second substrate 61B includes a main surface 611B and a main surface 612B facing each other in a thickness direction of the second substrate 61B. The second circuit portion 642B includes a plurality of second IDT electrodes 641B. In the present embodiment, the plurality of second IDT electrodes 641B are second functional electrodes. The second low acoustic velocity film 62B is provided on the main surface 611B of the second substrate 61B. That is, in the present embodiment, the second substrate 61B is the second support member. In addition, in the present embodiment, the main surface 611B of the second substrate 61B is a fourth main surface. The plurality of second IDT electrodes 641B are provided on the second piezoelectric layer 63B. The second filter 12 includes the second substrate 61B, the second low acoustic velocity film 62B, the second piezoelectric layer 63B, the plurality of second IDT electrodes 641B, and the second circuit portion 642B. In addition, in the second filter 12, the main surface 121 on an opposite side from the first filter 11 side is the main surface 612B of the second substrate 61B. In the present embodiment, the main surface 121 is a fifth main surface.

The materials of the first piezoelectric layer 63A and the second piezoelectric layer 63B are, for example, lithium niobate or lithium tantalate. The materials of the first low acoustic velocity film 62A and the second low acoustic velocity film 62B are, for example, silicon oxide. In the first low acoustic velocity film 62A, the acoustic velocity of a bulk wave propagating in the first low acoustic velocity film 62A is lower than the acoustic velocity of a bulk wave propagating in the first piezoelectric layer 63A. In addition, in the second low acoustic velocity film 62B, the acoustic velocity of a bulk wave propagating in the second low acoustic velocity film 62B is lower than the acoustic velocity of a bulk wave propagating in the second piezoelectric layer 63B. The materials of the first low acoustic velocity film 62A and the second low acoustic velocity film 62B are not limited to silicon oxide, and may be, for example, silicon oxide, glass, silicon oxynitride, tantalum oxide, a compound obtained by adding fluorine, carbon, or boron to silicon oxide, or a material containing the above-described materials as a main component.

The materials of the first substrate 61A and the second substrate 61B are, for example, silicon. In the first substrate 61A, the acoustic velocity of a bulk wave propagating in the first substrate 61A is higher than the acoustic velocity of a bulk wave propagating in the first piezoelectric layer 63A. Here, the bulk wave propagating in the first substrate 61A is a bulk wave having the lowest acoustic velocity among a plurality of bulk waves propagating in the first substrate 61A. In the present embodiment, a high acoustic velocity member is constituted by the first substrate 61A and the first low acoustic velocity film 62A provided on the first substrate 61A. In addition, in the present embodiment, the first substrate 61A is a first support substrate formed of a silicon substrate. Similarly, in the second substrate 61B, the acoustic velocity of a bulk wave propagating in the second substrate 61B is higher than the acoustic velocity of a bulk wave propagating in the second piezoelectric layer 63B. Here, the bulk wave propagating in the second substrate 61B is a bulk wave having the lowest acoustic velocity among a plurality of bulk waves propagating in the second substrate 61B. In the present embodiment, a high acoustic velocity member is constituted by the second substrate 61B and the second low acoustic velocity film 62B provided on the second substrate 61B. In addition, in the present embodiment, the second substrate 61B is a second support substrate formed of a silicon substrate. In addition, the materials of the first substrate 61A and the second substrate 61B are not limited to silicon, and may be, for example, materials containing, as a main component, any one of aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The main surface 611A of the first substrate 61A and the main surface 611B of the second substrate 61B face each other in the first direction D1. That is, the second filter 12 is disposed on the first filter 11. In addition, as shown in FIG. 2, the first electronic component 51 further includes a plurality of conductors 661 that are stretched in a direction intersecting with the first direction D1 and a frame 662. The plurality of conductors 661 and the frame 662 are electrodes for electrically connecting the second filter 12 and the mounting board 4 to each other. The plurality of conductors 661 include, for example, columnar (for example, prismatic) electrodes. In addition, the frame 662 is a frame-shaped electrode. The materials of the plurality of conductors 661 and the frame 662 are, for example, metal (for example, copper, a copper alloy, or the like). The plurality of conductors 661 and the frame 662 are located between the first substrate 61A and the second substrate 61B. A hollow space SP0 is formed inside the frame 662 between the first substrate 61A and the second substrate 61B. The plurality of first IDT electrodes 641A and the plurality of second IDT electrodes 641B are disposed in the hollow space SP0. At least the frame 662 or some of the plurality of conductors 661 is connected to the ground electrode of the mounting board 4 with a via conductor 671 and a bump 672 interposed therebetween. The via conductor 671 penetrates the first substrate 61A. The frame 662 does not need to be an electrode. In a case where the frame 662 is not an electrode, the material of the frame 662 may be an insulator such as a resin.

In addition, as shown in FIG. 2, the first electronic component 51 further includes a first shield electrode 65. The first shield electrode 65 is, for example, a shield electrode provided between the first IDT electrode 641A and the second IDT electrode 641B, for the purpose of an electromagnetic shielding. The first shield electrode 65 is one metal layer, but is not limited to one metal layer, and may have a multilayer structure in which a plurality of metal layers are laminated. The first shield electrode 65 is located in the hollow space SP0 and covers at least one of the first IDT electrode 641A or the second IDT electrode 641B. The first shield electrode 65 in Embodiment 1 covers the second IDT electrode 641B. More specifically, in a plan view from the first direction D1, the first shield electrode 65 overlaps the first IDT electrode 641A and overlaps the second IDT electrode 641B. Here, the phrase that the first shield electrode 65 overlaps the first IDT electrode 641A in a plan view from the first direction D1 means that there is a region including at least a part of the first IDT electrode 641A and at least a part of the first shield electrode 65. Similarly, the phrase that the first shield electrode 65 overlaps the second IDT electrode 641B in a plan view from the first direction D1 means that there is a region including at least a part of the second IDT electrode 641B and at least a part of the first shield electrode 65. The first shield electrode 65 divides the hollow space SP0 into a first space SP1 and a second space SP2. The first IDT electrode 641A is located in the first space SP1, and the second IDT electrode 641B is located in the second space SP2. The first space SP1 and the second space SP2 do not need to be completely isolated by the first shield electrode 65, and the first space SP1 and the second space SP2 may communicate with each other on the surface of the second piezoelectric layer 63B, for example.

(4.3) Resin Layer

Hereinafter, the relationship between the resin layer 68 and the first electronic component 51 will be described in detail.

The resin layer 68 covers at least a part of the first filter 11 and the second filter 12 in the first electronic component 51. Here, the resin layer 68 covers the outer peripheral surface of each of the first substrate 61A, the first low acoustic velocity film 62A, the first piezoelectric layer 63A, the conductor 661, the frame 662, the second piezoelectric layer 63B, the second low acoustic velocity film 62B, and the second substrate 61B. The resin layer 68 may cover at least a part of the main surface 612B of the second substrate 61B. The resin layer 68 contains resin (for example, epoxy resin). The resin layer may contain a filler in addition to the resin.

(4.4) Second Shield Electrode

A relationship between the second shield electrode 69 and the first electronic component 51 will be described below in detail.

The second shield electrode 69 covers at least a part of the resin layer 68. The second shield electrode 69 covers at least a part of the resin layer 68. Here, the second shield electrode 69 directly or indirectly covers the main surface 121 of the second filter 12 in the first electronic component 51. The phrase that the second shield electrode 69 indirectly covers the main surface 612B of the second substrate 61B means that at least a part of the resin layer 68 covers the main surface 121 of the second filter 12, and the second shield electrode 69 covers the part of the resin layer 68 that covers the main surface 121 of the second filter 12. In the present embodiment, the second shield electrode 69 is in contact with the main surface 121 of the second filter 12. The second shield electrode 69 may be connected to the ground electrode of the communication device 10. The second shield electrode 69 has a multilayer structure in which a plurality of metal layers are laminated, but is not limited to the multilayer structure, and may be one metal layer. One metal layer includes one type or a plurality of types of metal.

(5) Communication Device

As shown in FIG. 3, the communication device 10 includes the radio frequency module 1, the antenna 3, and the signal processing circuit 2.

(5.1) Antenna

The antenna 3 is connected to the antenna terminal 171 of the radio frequency module 1. The antenna 3 has a transmission function of emitting a transmission signal output from the radio frequency module 1 as radio waves, and a reception function of receiving a reception signal from an outside as radio waves and outputting the reception signal to the radio frequency module 1.

(5.2) Signal Processing Circuit

The signal processing circuit 2 includes the RF signal processing circuit 21 and a baseband signal processing circuit 22. The signal processing circuit 2 processes a signal passing through the radio frequency module 1. More specifically, the signal processing circuit 2 processes the transmission signal and the reception signal.

For example, the RF signal processing circuit 21 is a radio frequency integrated circuit (RFIC). The RF signal processing circuit 21 performs signal processing on a radio frequency signal.

The RF signal processing circuit 21 performs signal processing such as up-conversion on a radio frequency signal output from the baseband signal processing circuit 22, and outputs the radio frequency signal subjected to the signal processing to the radio frequency module 1. Specifically, the RF signal processing circuit 21 performs signal processing such as up-conversion on the transmission signal output from the baseband signal processing circuit 22, and outputs the transmission signal subjected to the signal processing to the first input terminal 172 or the second input terminal 173 of the radio frequency module 1.

The RF signal processing circuit 21 performs signal processing such as down-conversion on a radio frequency signal output from the radio frequency module 1, and outputs the radio frequency signal subjected to the signal processing to the baseband signal processing circuit 22. Specifically, the RF signal processing circuit 21 performs signal processing on the reception signal output from the first output terminal 174 or the second output terminal 175 of the radio frequency module 1, and outputs the reception signal subjected to the signal processing to the baseband signal processing circuit 22.

For example, the baseband signal processing circuit 22 is a baseband integrated circuit (BBIC). The baseband signal processing circuit 22 performs predetermined signal processing on the transmission signal from the outside of the signal processing circuit 2. The reception signal processed by the baseband signal processing circuit 22 is used, for example, as an image signal for an image display or as an audio signal for a call.

In addition, the RF signal processing circuit 21 also has a function as a control unit that controls each of the first switch 13 and the second switch 14 included in the radio frequency module 1 based on the transmission and reception of the radio frequency signals (transmission signal and reception signal). Specifically, the RF signal processing circuit 21 switches the connection of each of the first switch 13 and the second switch 14 of the radio frequency module 1 by a control signal (not shown). The control unit may be provided outside the RF signal processing circuit 21, and may be provided in the radio frequency module 1 or the baseband signal processing circuit 22, for example.

(6) Details of the First Shield Electrode

The details of the first shield electrode 65 will be described below with reference to the drawings.

As shown in FIG. 2, the first shield electrode 65 covers the second IDT electrode 641B. As a result, the first shield electrode 65 functions as an electromagnetic shielding between the first space SP1 in which the first IDT electrode 641A is located and the second space SP2 in which the second IDT electrode 641B is located. Thus, it is possible to improve the isolation between the first filter 11 and the second filter 12.

As described above, in the radio frequency module 1, transmission of a transmission signal in the first communication band and reception of a reception signal in the second communication band may be performed simultaneously. In addition, in the radio frequency module 1, reception of a reception signal in the first communication band and transmission of a transmission signal in the second communication band may be performed simultaneously. The signal strength of a transmission signal passing through the radio frequency module 1 is higher than the signal strength of a reception signal passing through the radio frequency module 1. On the other hand, in the radio frequency module 1 according to Embodiment 1, since the first shield electrode 65 is an electromagnetic shielding between the first IDT electrode 641A and the second IDT electrode 641B, it is possible to improve the isolation between the first filter 11 and the second filter 12.

In addition, in the radio frequency module 1 according to Embodiment 1, the conductor 661 or the frame 662 located between the second substrate 61B and the first substrate 61A and the via conductor 671 that penetrates the first substrate 61A in the first direction D1 are connected to the ground electrode of the mounting board 4. Therefore, the conductor 661 or the frame 662, and the via conductor 671 function as an electromagnetic shielding between the first IDT electrode 641A and the outside of the first filter 11. Therefore, the signal quality of a signal passing through the first filter 11 is improved. That is, in the radio frequency module 1, the noise resistance of the first filter 11 is improved.

In addition, in the radio frequency module 1 according to Embodiment 1, the second IDT electrode 641B is surrounded by the first shield electrode 65 and the second shield electrode 69. Thus, the first shield electrode 65 and the second shield electrode 69 function as an electromagnetic shielding between the second IDT electrode 641B and the outside of the second filter 12. Therefore, the signal quality of a signal passing through the second filter 12 is improved. That is, in the radio frequency module 1, the noise resistance of the second filter 12 is improved.

(7) Effects

In the radio frequency module 1 according to Embodiment 1, the first shield electrode 65 is located in the hollow space SP0 and covers at least one of the first IDT electrode 641A that is the first functional electrode, and the second IDT electrode 641B that is the second functional electrode. Thus, even in a case where a transmission signal passes through the first filter 11 and a reception signal passes through the second filter 12, it is possible to improve the isolation between the first filter 11 and the second filter 12. Similarly, even in a case where a reception signal passes through the first filter 11 and a transmission signal passes through the second filter 12, it is possible to improve the isolation between the first filter 11 and the second filter 12. Thus, it is possible to perform asynchronous communication between the TDD communication in the first communication band using the first filter 11 and the TDD communication in the second communication band using the second filter 12.

In addition, in the radio frequency module 1 according to Embodiment 1, the resin layer 68 covers at least a part of the first filter 11 and the second filter 12, and the second shield electrode 69 covers at least a part of the resin layer 68. Therefore, the second shield electrode 69 functions as an electromagnetic shielding between the first filter 11 and the second filter 12, and between the outside of the first filter 11 and the outside of the second filter 12. As a result, the signal quality of a signal passing through the radio frequency module 1 is improved. That is, in the radio frequency module 1, the noise resistance of the first filter 11 and the second filter 12 is improved.

In addition, in the radio frequency module 1 according to Embodiment 1, the second shield electrode 69 is in contact with the main surface 121 of the second filter 12. Thus, the second IDT electrode 641B is surrounded by the first shield electrode 65 and the second shield electrode 69. As a result, the first shield electrode 65 and the second shield electrode 69 function as an electromagnetic shielding between the second IDT electrode 641B and the outside of the second filter 12. Therefore, the signal quality of a signal passing through the second filter 12 is improved. That is, in the radio frequency module 1, the noise resistance of the second filter 12 is improved.

In addition, in the radio frequency module 1 according to Embodiment 1, the sixth electronic component 56 overlaps the first electronic component 51 in a plan view from the first direction D1 that is the thickness direction of the mounting board 4. That is, in a plan view from the first direction D1 that is the thickness direction of the mounting board 4, the first filter 11 and the second filter 12 overlap the first switch 13 and the second switch 14. Thus, a wiring between the first filter 11 and the common terminal 130 of the first switch 13 is short. In addition, a wiring between the second filter 12 and the common terminal 140 of the second switch 14 is short. Therefore, the signal quality of each of signals passing through the first filter 11 and the second filter 12 is improved. That is, in the radio frequency module 1, the noise resistance of the first filter 11 and the second filter 12 is improved.

In addition, in the radio frequency module 1 according to Embodiment 1, the conductor 661 or the frame 662 located between the second substrate 61B and the first substrate 61A and the via conductor 671 that penetrates the first substrate 61A in the first direction D1 are connected to the ground electrode of the mounting board 4. Therefore, the conductor 661 or the frame 662, and the via conductor 671 function as an electromagnetic shielding between the first IDT electrode 641A and the outside of the first filter 11. Thus, the signal quality of a signal passing through the first filter 11 is improved. That is, in the radio frequency module 1, the noise resistance of the first filter 11 is improved.

In addition, in the radio frequency module 1 according to Embodiment 1, the maximum output power of the power class of a signal passing through the second filter 12 is higher than the maximum output power of the power class of a signal passing through the first filter 11. Thus, the heat generation by the second filter 12 is larger than the heat generation by the first filter 11. In the radio frequency module 1 according to Embodiment 1, since there is a heat dissipation path for dissipating the heat generated in the second filter 12 from the second shield electrode 69, it is possible to reduce the influence of the heat generated in the second filter 12 on both the first filter 11 and the second filter 12.

Embodiment 2

A radio frequency module 1 according to Embodiment 2 will be described. Regarding the radio frequency module 1 according to Embodiment 2, the similar configuration to the radio frequency module 1 according to Embodiment 1 is denoted by the same reference numerals, and the description thereof will be omitted.

Figure 4:
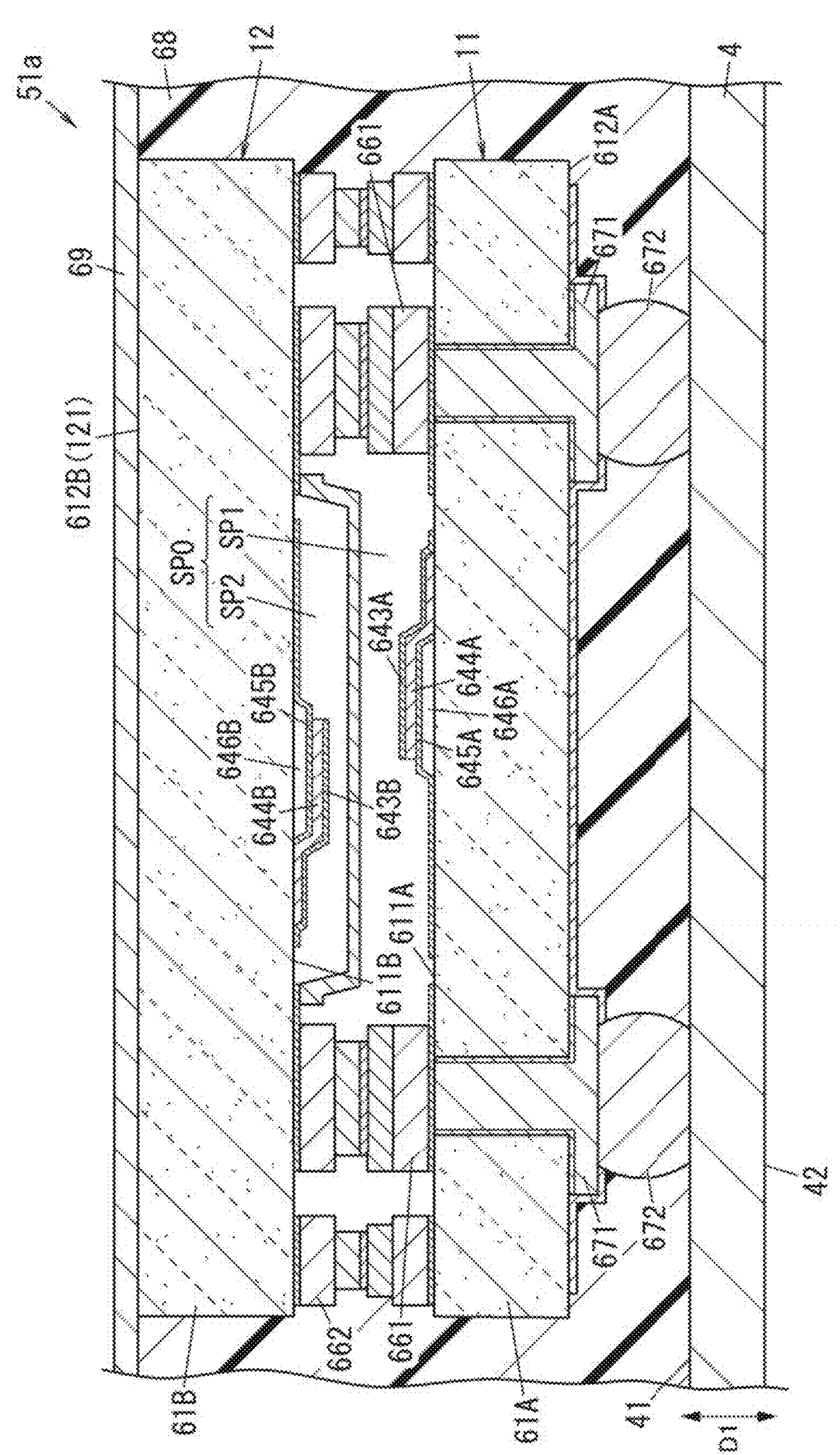
FIG. 4 is a cross-sectional view of a radio frequency module according to Embodiment 2.

The radio frequency module 1 according to Embodiment 2 includes a first electronic component 51*a* instead of the first electronic component 51. As shown in FIG. 4, the first electronic component 51*a* includes a bulk acoustic wave (BAW) filter as each of a first filter 11 and a second filter 12.

The detailed structure of the first electronic component 51*a* will be described. As shown in FIG. 4, the first electronic component 51*a* includes a first substrate 61A, a first upper electrode 643A, a first piezoelectric film 644A, and a first lower electrode 645A. In the present embodiment, the first upper electrode 643A is a first functional electrode. The material of the first piezoelectric film 644A is, for example, AlN, ScAlN, or PZT (lead zirconate titanate). The first lower electrode 645A has a cavity 646A between the first lower electrode 645A and the first substrate 61A. A BAW resonator included in the first filter 11 is a film bulk acoustic resonator (FBAR), but is not limited to this, and may be a solidly mounted resonator (SMR). The first filter 11 includes the first substrate 61A, the first upper electrode 643A, the first piezoelectric film 644A, and the first lower electrode 645A. The first upper electrode 643A, the first piezoelectric film 644A, and the first lower electrode 645A are located in a hollow space SP0 formed between a main surface 611A of the first substrate 61A and a main surface 611B of the second substrate 61B.

In addition, as shown in FIG. 4, the first electronic component 51*a* includes a second substrate 61B, a second upper electrode 643B, a second piezoelectric film 644B, and a second lower electrode 645B. In the present embodiment, the second upper electrode 643B is a second functional electrode. The material of the second piezoelectric film 644B is, for example, AlN, ScAlN, or PZT. The second lower electrode 645B has a cavity 646B between the second lower electrode 645B and the second substrate 61B. A BAW resonator included in the second filter 12 is an FBAR, but is not limited to this, and may be an SMR. The second filter 12 includes the second substrate 61B, the second upper electrode 643B, the second piezoelectric film 644B, and the second lower electrode 645B. The second upper electrode 643B, the second piezoelectric film 644B, and the second lower electrode 645B are located in the hollow space SP0.

In the radio frequency module 1 according to Embodiment 2, the first shield electrode 65 covers one of the first upper electrode 643A and the second upper electrode 643B. In the present embodiment, the first shield electrode 65 covers the second upper electrode 643B. More specifically, the first shield electrode 65 divides the hollow space SP0 into a first space SP1 in which the first upper electrode 643A is located, and a second space SP2 in which the second upper electrode 643B is located. In addition, in a plan view from the first direction D1, the first shield electrode 65 overlaps both the first upper electrode 643A and the second upper electrode 643B.

Therefore, also in the radio frequency module 1 according to Embodiment 2, the first shield electrode 65 functions as an electromagnetic shielding between the first space SP1 in which the first upper electrode 643A is located, and the second space SP2 in which the second upper electrode 643B is located. Thus, it is possible to improve the isolation between the first filter 11 and the second filter 12.

In addition, in the radio frequency module 1 according to Embodiment 2, the resin layer 68 covers at least a part of the first filter 11 and the second filter 12, and the second shield electrode 69 covers at least a part of the resin layer 68. Therefore, the second shield electrode 69 functions as an electromagnetic shielding between the first filter 11 and the second filter 12, and between the outside of the first filter 11 and the outside of the second filter 12. As a result, the signal quality of a signal passing through the radio frequency module 1 is improved. That is, in the radio frequency module 1, the noise resistance of the first filter 11 and the second filter 12 is improved.

In addition, in the radio frequency module 1 according to Embodiment 2, the second upper electrode 643B is surrounded by the first shield electrode 65 and the second shield electrode 69. As a result, the first shield electrode 65 and the second shield electrode 69 function as an electromagnetic shielding between the second upper electrode 643B and the outside of the second filter 12. Therefore, the signal quality of a signal passing through the second filter 12 is improved. That is, in the radio frequency module 1, the noise resistance of the second filter 12 is improved.

In addition, in the radio frequency module 1 according to Embodiment 2, in a plan view from the first direction D1 that is the thickness direction of the mounting board 4, the first electronic component 51*a* including the first filter 11 and the second filter 12 overlaps the sixth electronic component 56 including the first switch 13 and the second switch 14. Thus, a wiring between the first filter 11 and the common terminal 130 of the first switch 13 is short. In addition, a wiring between the second filter 12 and the common terminal 140 of the second switch 14 is short. Therefore, the signal quality of each of a signal flowing through the first filter 11 and a signal passing through the second filter 12 is improved. That is, in the radio frequency module 1, the noise resistance of the first filter 11 and the second filter 12 is improved.

In addition, in the radio frequency module 1 according to Embodiment 2, the conductor 661 or the frame 662 located between the second substrate 61B and the first substrate 61A and the via conductor 671 that penetrates the first substrate 61A in the first direction D1 are connected to the ground electrode of the mounting board 4. Thus, the conductor 661 and the via conductor 671 function as an electromagnetic shielding between the first upper electrode 643A, the first piezoelectric film 644A, the first lower electrode 645A, the second upper electrode 643B, the second piezoelectric film 644B, the second lower electrode 645B, and the outside of the first electronic component 51*a*. Thus, the signal quality of a signal passing through the radio frequency module 1 is improved. That is, in the radio frequency module 1, the noise resistance of the first filter 11 and the second filter 12 is improved.

Embodiment 3

A radio frequency module 1*b* according to Embodiment 3 will be described with reference to FIGS. 5 and 6. Regarding the radio frequency module 1*b* according to Embodiment 3, the similar configuration to the radio frequency module 1 according to Embodiment 1 is denoted by the same reference numerals, and the description thereof will be omitted.

Figure 6:
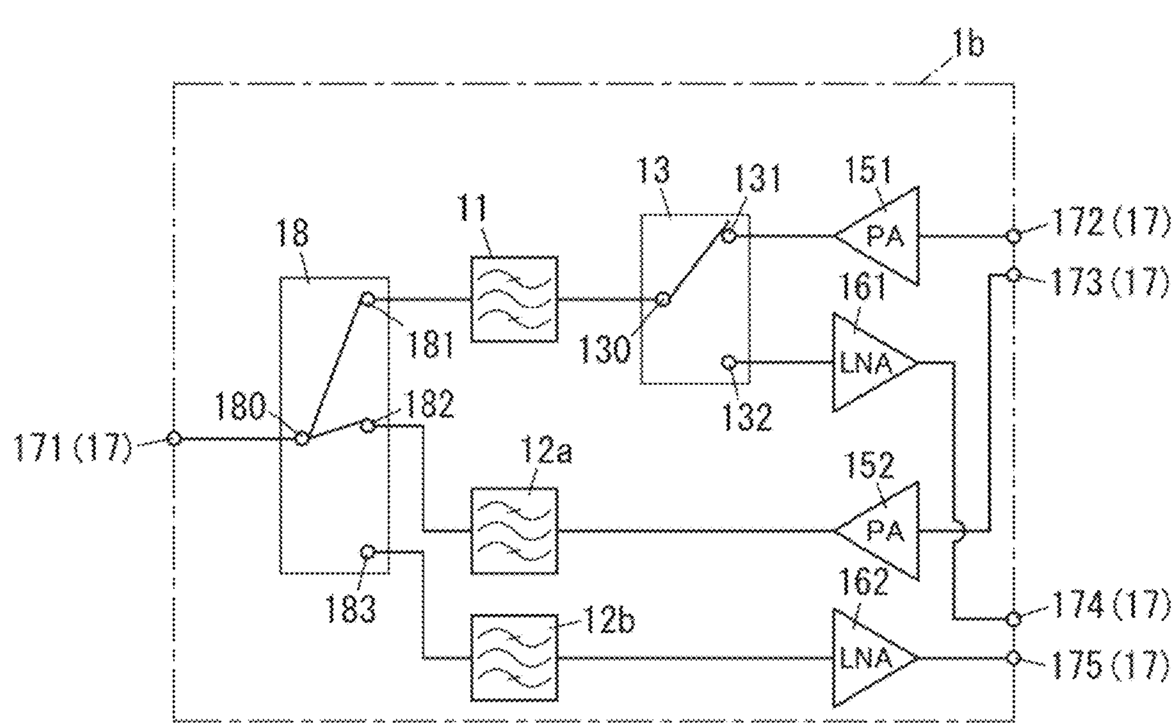
FIG. 6 is a circuit configuration diagram of the radio frequency module.

According to Embodiment 3, the radio frequency module 1*b* includes a second transmission filter 12*a* and a second reception filter 12*b* instead of the second filter 12, as shown in FIG. 6. In addition, as shown in FIG. 6, the radio frequency module 1*b* according to Embodiment 3 does not include the second switch 14 but includes a third switch 18.

(1) Circuit Configuration of Radio Frequency Module

The radio frequency module 1*b* according to Embodiment 3 includes a first filter 11, the second transmission filter 12*a*, and the second reception filter 12*b*, as shown in FIG. 6. In addition, the radio frequency module 1*b* according to Embodiment 3 further includes the first switch 13 and the third switch 18. In addition, the radio frequency module 1*b* according to Embodiment 3 further includes a power amplifier 151, a power amplifier 152, a low-noise amplifier 161, and a low-noise amplifier 162. Further, the radio frequency module 1 according to Embodiment 1 further includes a plurality of (five in the shown example) external connection terminals 17. The plurality of external connection terminals 17 include an antenna terminal 171, a first input terminal 172, a second input terminal 173, a first output terminal 174, and a second output terminal 175.

(1.1) Second Transmission Filter, Second Reception Filter

The second transmission filter 12*a* and the second reception filter 12*b* are filters that cause signals in a frequency band different from that of the first filter 11 to pass therethrough. More specifically, the second transmission filter 12*a* is a filter that causes a transmission signal in the second communication band to pass through the second transmission filter 12*a*. The second reception filter 12*b* is a filter that causes a reception signal in the second communication band to pass through the second reception filter 12*b*.

Each of the second transmission filter 12*a* and the second reception filter 12*b* is an acoustic wave filter including one or more acoustic wave resonators. The first filter 11, the second transmission filter 12*a*, and the second reception filter 12*b* are included in a single electronic component.

The second transmission filter 12*a* has an input terminal (not shown) and an output terminal (not shown). The input terminal of the second transmission filter 12*a* is connected to the output terminal of the power amplifier 152. In addition, the output terminal of the second transmission filter 12*a* is connected to the selection terminal 182 of the third switch 18.

The second reception filter 12*b* has an input terminal (not shown) and an output terminal (not shown). The input terminal of the second reception filter 12*b* is connected to the selection terminal 183 of the third switch 18. In addition, the output terminal of the second reception filter 12*b* is connected to the input terminal of the low-noise amplifier 162.

(1.2) Third Switch

As shown in FIG. 6, the third switch 18 is a switch for switching a path connected to the antenna terminal 171 from among the first filter 11, the second transmission filter 12*a*, and the second reception filter 12*b*. In other words, the third switch 18 is a switch for switching a path to be connected to the antenna terminal 171. The third switch 18 has a common terminal 180 and a plurality of (three in the shown example) selection terminals 181, 182, and 183.

The common terminal 180 is connected to the antenna terminal 171. The selection terminal 181 is connected to the first filter 11. In addition, the selection terminal 182 is connected to the second transmission filter 12*a*. In addition, the selection terminal 183 is connected to the second reception filter 12*b*.

The third switch 18 switches the connection between the common terminal 180 and the plurality of selection terminals 181, 182, and 183. More specifically, the third switch 18 connects the common terminal 180 to any of the selection terminals 182 and 183, or does not connect the common terminal 180 to either of the selection terminals 182 and 183. In addition, the third switch 18 connects or does not connect the selection terminal 181 to the common terminal 180.

(2) Structure of Radio Frequency Module

Next, the structure of the radio frequency module 1*b* according to Embodiment 3 will be described.

The radio frequency module 1*b* according to Embodiment 3 includes a first electronic component 51*b* instead of the first electronic component 51. The first electronic component 51*b* includes the first filter 11, the second transmission filter 12*a*, and the second reception filter 12*b*.

Each of the first filter 11, the second transmission filter 12*a*, and the second reception filter 12*b* is, for example, an acoustic wave filter including a plurality of series arm resonators and a plurality of parallel arm resonators.

Figure 5:
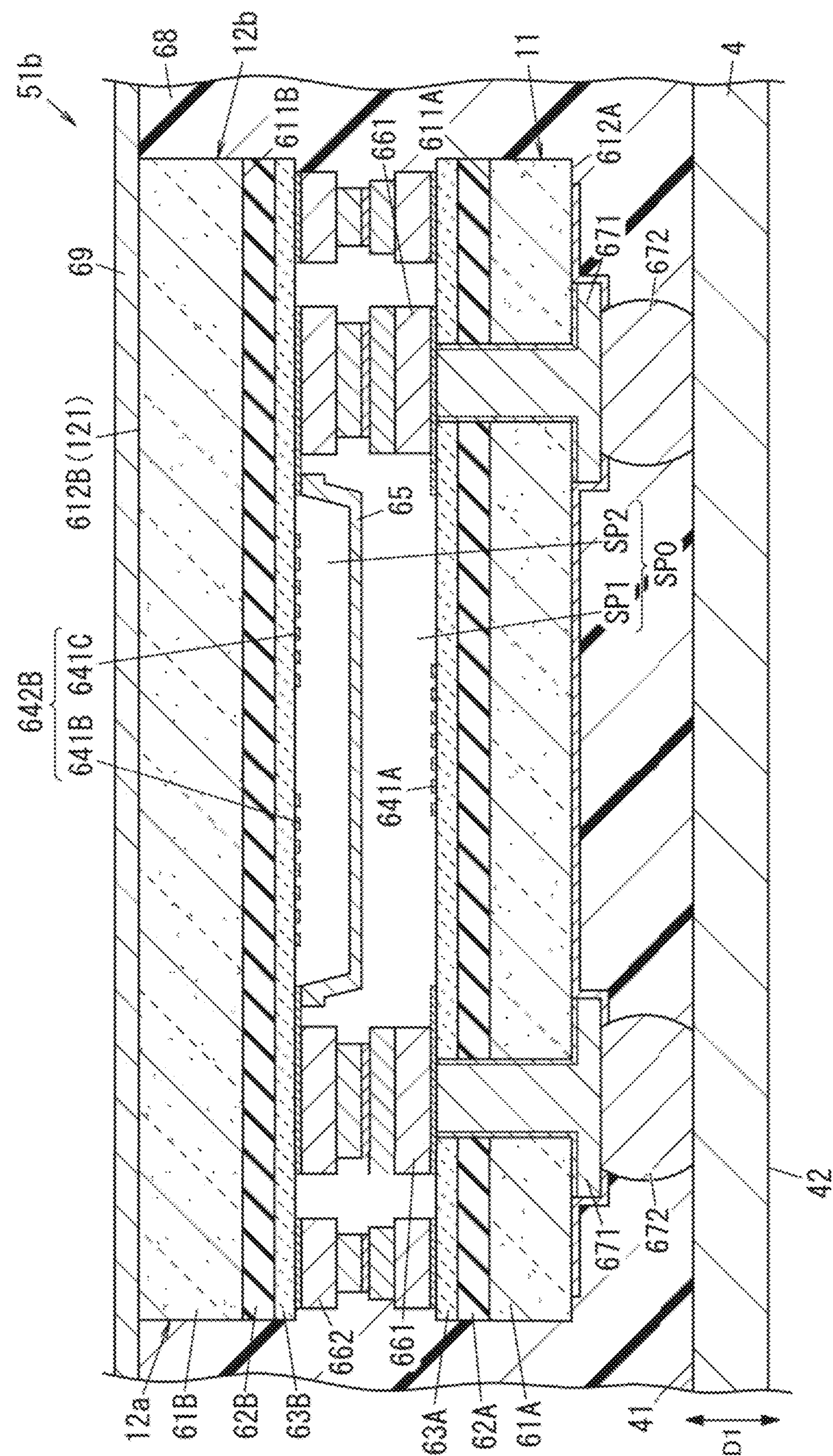
FIG. 5 is a cross-sectional view of a radio frequency module according to Embodiment 3.

As shown in FIG. 5, the first electronic component 51*b* includes a first substrate 61A, a first low acoustic velocity film 62A, a first piezoelectric layer 63A, and a first circuit portion 642A. The first substrate 61A includes a main surface 611A and a main surface 612A facing each other in a thickness direction of the first substrate 61A. The first circuit portion 642A includes a plurality of first IDT electrodes 641A. In the present embodiment, the plurality of first IDT electrodes 641A are first functional electrodes. The first low acoustic velocity film 62A is provided on the main surface 611A of the first substrate 61A. The plurality of first IDT electrodes 641A are provided on the first piezoelectric layer 63A. The first filter 11 includes the first substrate 61A, the first low acoustic velocity film 62A, the first piezoelectric layer 63A, the plurality of first IDT electrodes 641A, and the first circuit portion 642A. The plurality of first IDT electrodes 641A are located in the hollow space SP0 formed between the main surface 611A of the first substrate 61A and the main surface 611B of the second substrate 61B.

As shown in FIG. 5, the first electronic component 51*b* further includes a second substrate 61B, a second low acoustic velocity film 62B, a second piezoelectric layer 63B, and a second circuit portion 642B. The second substrate 61B includes a main surface 611B and a main surface 612B facing each other in a thickness direction of the second substrate 61B. The second circuit portion 642B includes a plurality of second IDT electrodes 641B and a plurality of third IDT electrodes 641C. In the present embodiment, the plurality of second IDT electrodes 641B and third IDT electrodes 641C function as the second functional electrodes. The second low acoustic velocity film 62B is provided on the main surface 611B of the second substrate 61B. The second transmission filter 12*a* includes the second substrate 61B, the second low acoustic velocity film 62B, the second piezoelectric layer 63B, and the plurality of second IDT electrodes 641B. In addition, the second reception filter 12*b* includes the second substrate 61B, the second low acoustic velocity film 62B, the second piezoelectric layer 63B, and the third IDT electrode 641C. That is, the second transmission filter 12*a* and the second reception filter 12*b* are disposed on the first filter 11. In the present embodiment, the second transmission filter 12*a* and the second reception filter 12*b* are second acoustic wave filters. The second IDT electrode 641B and the third IDT electrode 641C are located in the hollow space SP0. In addition, the main surface 121 of the second transmission filter 12*a* and the second reception filter 12*b* on an opposite side from the first filter 11 side is the main surface 612B of the second substrate 61B.

The first shield electrode 65 is a shield electrode provided for the purpose of the electromagnetic shielding between the first IDT electrode 641A, and the second IDT electrode 641B and the third IDT electrode 641C. The first shield electrode 65 covers at least one of the first IDT electrode 641A, the second IDT electrode 641B, and the third IDT electrode 641C. In the present embodiment, the first shield electrode 65 covers the second IDT electrode 641B and the third IDT electrode 641C. More specifically, the first shield electrode 65 divides the hollow space SP0 into the first space SP1 in which the first IDT electrode 641A is located, and the second space SP2 in which the second IDT electrode 641B and the third IDT electrode 641C are located. In addition, in a plan view from the first direction D1, the first shield electrode 65 overlaps the first IDT electrode 641A and overlaps the second IDT electrode 641B and the third IDT electrode 641C.

(3) Effects

In the radio frequency module 1*b* according to Embodiment 3, the first shield electrode 65 is located in the hollow space SP0 and covers at least one of the first IDT electrode 641A that is the first functional electrode, and the second IDT electrode 641B and the third IDT electrode 641C that are the second functional electrodes. Thus, it is possible to improve the isolation between the first filter 11, and the second transmission filter 12*a* and the second reception filter 12*b*. In particular, in a case where a transmission signal passes through the first filter 11 and a reception signal passes through the second reception filter 12*b*, it is possible to improve the isolation between the first filter 11 and the second reception filter 12*b*. Similarly, even in a case where a reception signal passes through the first filter 11 and a transmission signal passes through the second transmission filter 12*a*, it is possible to improve the isolation between the first filter 11 and the second transmission filter 12*a*. Thus, it is possible to perform simultaneous communication between the TDD communication in the first communication band using the first filter 11 and the TDD communication in the second communication band using the second filter 12 in an asynchronous manner.

In addition, in the radio frequency module 1*b* according to Embodiment 3, the resin layer 68 covers at least a part of the first filter 11, the second transmission filter 12*a*, and the second reception filter 12*b*, and the second shield electrode 69 covers at least a part of the resin layer 68. Thus, the second shield electrode 69 functions as an electromagnetic shielding between the first filter 11, the second transmission filter 12*a*, and the second reception filter 12*b*, and the outside of the first filter 11, the outside of the second transmission filter 12*a*, and the outside of the second reception filter 12*b*. As a result, the signal quality of a signal passing through the radio frequency module 1 is improved. That is, in the radio frequency module 1*b*, the noise resistance of the first filter 11, the second transmission filter 12*a*, and the second reception filter 12*b* is improved.

In addition, in the radio frequency module 1*b* according to Embodiment 3, the second shield electrode 69 is in contact with the main surface 121 of the second transmission filter 12*a* and the second reception filter 12*b* on an opposite side from the first filter 11 side. Thus, the second IDT electrode 641B and the third IDT electrode 641C are surrounded by the first shield electrode 65 and the second shield electrode 69. As a result, the first shield electrode 65 and the second shield electrode 69 function as an electromagnetic shielding between the second IDT electrode 641B and the third IDT electrode 641C, and the outsides of the second transmission filter 12*a* and the second reception filter 12*b*. Therefore, the signal quality of signals passing through the second transmission filter 12*a* and the second reception filter 12*b* is improved. That is, in the radio frequency module 1*b*, the noise resistance of the second transmission filter 12*a* and the second reception filter 12*b* is improved.

In addition, in the radio frequency module 1*b* according to Embodiment 3, in a plan view from the first direction D1 that is the thickness direction of the mounting board 4, the first electronic component 51*b* including the first filter 11 overlaps the sixth electronic component 56 including the first switch 13. Thus, a wiring between the first filter 11 and the common terminal 130 of the first switch 13 is short.

Therefore, the signal quality of a signal passing through the first filter 11 is improved. That is, in the radio frequency module 1*b*, the noise resistance of the first filter 11 is improved.

In addition, in the radio frequency module 1*b* according to Embodiment 3, a conductor 661 located between the second substrate 61B and the first substrate 61A and a via conductor 671 that penetrates the first substrate 61A in the first direction D1 are connected to the ground electrode of the mounting board 4. Therefore, the conductor 661 and the via conductor 671 function as an electromagnetic shielding between the first IDT electrode 641A and the outside of the first electronic component 51*b*. Thus, the signal quality of a signal passing through the first filter 11 is improved. That is, in the radio frequency module 1*b*, the noise resistance of the first filter 11 is improved.

In addition, in the radio frequency module 1*b* according to Embodiment 3, the maximum output power of the power class of a signal passing through the second transmission filter 12*a* and the second reception filter 12*b* is higher than the maximum output power of the power class of a signal passing through the first filter 11. Thus, the heat generation by the second transmission filter 12*a* and the second reception filter 12*b* is larger than the heat generation by the first filter 11. In the radio frequency module 1 according to Embodiment 1, there is a heat dissipation path for dissipating the heat generated in the second transmission filter 12*a* and the second reception filter 12*b* from the second shield electrode 69. Therefore, it is possible to reduce the influence of the heat generated in the second transmission filter 12*a* and the second reception filter 12*b* on the first filter 11, the second transmission filter 12*a*, and the second reception filter 12*b*.

Modification Examples

Modification Examples of Embodiments 1 to 3 will be described below.

Each of the first filter 11, the second filter 12, the second transmission filter 12*a*, and the second reception filter 12*b* according to Embodiments 1 and 3 is not limited to a ladder filter and may be, for example, a longitudinally coupled resonator type acoustic wave filter.

In addition, each of the first filter 11, the second filter 12, the second transmission filter 12*a*, and the second reception filter 12*b* according to Embodiments 1 and 3 is a surface acoustic wave filter. In addition, each of the first filter 11 and the second filter 12 according to Embodiment 2 is a bulk acoustic wave filter. The acoustic wave filters are not limited to these. For example, the first filter 11 may be a surface acoustic wave filter, and the second filter 12 may be a bulk acoustic wave filter. In addition, the acoustic wave filter may be, for example, an acoustic wave filter using a boundary acoustic wave, a plate wave, or the like.

The first filter 11 according to Embodiment 3 is a transmission/reception filter through which both the transmission signal and the reception signal pass, but the present disclosure is not limited to this. For example, a combination of a first transmission filter and a first reception filter may be used, similar to the second transmission filter 12*a* and the second reception filter 12*b*. Similarly, in the first filter 11 and the second filter 12 according to Embodiment 2, at least one of the first filter 11 and the second filter 12 may be a combination of a transmission filter and a reception filter.

In addition, the first filter 11 and the second filter 12 according to Embodiments 1 and 2 are transmission/reception filters through which both a transmission signal and a reception signal pass, but the present disclosure is not limited to this. For example, the first filter 11 may be a transmission filter, and the second filter 12 may be a reception filter. In addition, for example, the first filter 11 may be a reception filter, and the second filter 12 may be a transmission filter. In these cases, either the first filter 11 or the second filter 12 may be a transmission/reception filter.

In the radio frequency modules 1 and 1*b* according to Embodiments 1 to 3, it is assumed that the first shield electrode 65 covers the second IDT electrode 641B, the third IDT electrode 641C, or the second upper electrode 643B. However, the present disclosure is not limited to this. For example, the first shield electrode 65 may be configured to cover the first IDT electrode 641A. In addition, for example, the radio frequency module 1 may be configured to include two first shield electrodes 65, and each of the first IDT electrode 641A and the second IDT electrode 641B may be configured to be covered by different first shield electrodes 65.

In the radio frequency modules 1 and 1*b* according to Embodiments 1 to 3, the first communication band is Band 39 of the 3GPP LTE standard, and the second communication band is Band 41 of the 3GPP LTE standard, but the present disclosure is not limited to this. The combination of the first communication band and the second communication band is freely made as long as both the first communication band and the second communication band are TDD bands, and the asynchronous communication is possible For example, the combination of the first communication band and the second communication band may be a combination of Band 39 and Band 40 of the 3GPP LTE standard. In addition, for example, the combination of the first communication band and the second communication band may be a combination of Band 40 and Band 41 of the 3GPP LTE standard. In this case, in a case where the power class of the signal in the second communication band is larger than the power class of the signal in the first communication band, the heat generated in the second filter 12 is dissipated from the second shield electrode 69 as described above, so that the heat dissipation properties of the radio frequency module 1 are improved.

The power class of the signal in the first communication band may be larger than the power class of the signal in the second communication band. For example, the first communication band is Band 41 of the 3GPP LTE standard, and the second communication band is Band 39 of the 3GPP LTE standard. In this case, the heat generated in the first filter 11 is dissipated from the mounting board 4, so that the heat dissipation properties of the radio frequency module 1 are improved.

In the radio frequency modules 1 and 1*b* according to Embodiments 1 to 3, the sixth electronic component 56 includes the first switch 13 and the second switch 14, and overlaps the first electronic component 51 in a plan view from the first direction D1, but the present disclosure is not limited to this. For example, the sixth electronic component 56 may include the first switch 13, the radio frequency module 1 may include a seventh electronic component including the second switch 14, the seventh electronic component may be disposed at the second main surface 42 of the mounting board 4, and the seventh electronic component may overlap the first electronic component 51 in the plan view from the first direction D1.

The radio frequency modules 1 and 1*b* according to Embodiments 1 to 3 include the antenna terminal 171, and the antenna 3 of the communication device 10 is connected to the antenna terminal 171 of the radio frequency modules

1 and 1*b*. However, the present disclosure is not limited to this. For example, the radio frequency modules 1 and 1*b* may include a plurality of antenna terminals, and the communication device 10 may include antennas connected to the plurality of respective antenna terminals. In this case, the radio frequency modules 1 and 1*b* include an antenna switch that selects which transmission path, reception path, or transmission and reception path each of the plurality of antenna terminals is to be connected. The antenna switch may be integrated with the third switch 18 according to Embodiment 3.

In the present specification, "an element is disposed at a first main surface of a board" includes not only a case where the element is directly mounted on the first main surface of the board but also a case where the element is disposed in a space on the first main surface side between the space on the first main surface side and a space on the second main surface side separated by the board. That is, "the element is disposed at the first main surface of the board" includes a case where the element is mounted on the first main surface of the board with another circuit element, an electrode, or the like interposed therebetween. The element is, for example, the first electronic component 51, but is not limited to the first electronic component 51. The board is, for example, the mounting board 4. In a case where the board is the mounting board 4, the first main surface is the first main surface 41, and the second main surface is the second main surface 42.

(Aspects)

The following aspects are disclosed in the present specification.

A radio frequency module (1; 1*b*) according to a first aspect includes a mounting board (4), a first acoustic wave filter (11), a second acoustic wave filter (12; 12*a*, 12*b*), and a first shield electrode (65). The mounting board (4) has a first main surface (41) and a second main surface (42) facing each other. The first acoustic wave filter (11) is disposed at the first main surface (41) of the mounting board (4). The second acoustic wave filter (12; 12*a*, 12*b*) is disposed on the first acoustic wave filter (11). The first acoustic wave filter (11) supports transmission or reception in a first communication band for TDD. The second acoustic wave filter (12; 12*a*, 12*b*) supports the transmission or reception of the second communication band for TDD. The combination of the first acoustic wave filter (11) and the second acoustic wave filter (12; 12*a*, 12*b*) is a combination of a filter that supports transmission and a filter that supports reception. Asynchronous communication is able to be performed in the first communication band and the second communication band. The first acoustic wave filter (11) includes a first support member (61A) and first functional electrodes (641A; 643A). The first support member (61A) has a third main surface (611A). The first functional electrode (641A; 643A) is provided at the third main surface (611A) of the first support member (61A). The second acoustic wave filter (12; 12*a*, 12*b*) includes a second support member (61B) and second functional electrodes (641B, 641C; 643B). The second support member (61B) has a fourth main surface (611B). The second functional electrode (641B, 641C, 643B) is provided at the fourth main surface (611B) of the second support member (61B). The first functional electrode (641A; 643A) and the second functional electrodes (641B, 641C; 643B) are located in a hollow space SP0 and face each other. The hollow space (SP0) is formed between the first support member (61A) and the second support member (61B) in the thickness direction (D1) of the mounting board (4). The first shield electrode (65) is located in the hollow space (SP0) and covers at least one of the first functional electrode (641A; 643A) or the second functional electrode (641B, 641C; 643B).

With the radio frequency module (1; 1*b*) according to the above aspect, the first shield electrode (65) functions as an electromagnetic shielding between the first functional electrode (641A; 643A) and the second functional electrodes (641B, 641C; 643B). Thus, during asynchronous communication in TDD, it is possible to improve the isolation between the first acoustic wave filter (11) and the second acoustic wave filter (12; 12*a*, 12*b*).

A radio frequency module (1) according to a second aspect in the first aspect further includes a first switch (13) and a second switch (14). The first switch (13) is connected to the first acoustic wave filter (11). The second switch (14) is connected to the second acoustic wave filter (12).

With the radio frequency module (1) according to the above aspect, the first acoustic wave filter (11) and the second acoustic wave filter (12) can be used as transmission/reception filters. In addition, with the radio frequency module (1) according to the above aspect, the first acoustic wave filter (11) and the second acoustic wave filter (12) can be shared by a plurality of external circuits using the same communication band. Thus, it is possible to reduce the size of the radio frequency module (1).

A radio frequency module (1) according to a third aspect in the second aspect further includes an electronic component (56) disposed on the second main surface (42) of the mounting board (4). The electronic component (56) is an IC that includes at least one of the first switch (13) and the second switch (14).

With the radio frequency module (1) according to the above aspect, the first switch (13) or the second switch (14), and the first acoustic wave filter (11) and the second acoustic wave filter (12) are disposed at different main surfaces of the mounting board (4). Thus, it is possible to improve the isolation between the first acoustic wave filter (11) and the second acoustic wave filter (12).

In a radio frequency module (1) according to a fourth aspect, in the third aspect, the electronic component (56) overlaps the first acoustic wave filter (11) in a plan view from the thickness direction (D1) of the mounting board (4).

With the radio frequency module (1) according to the above aspect, it is possible to shorten at least one of a wiring between the first switch (13) and the first acoustic wave filter (11) and a wiring between the second switch (14) and the second acoustic wave filter (12). Thus, it is possible to improve the signal quality of a signal passing through the first acoustic wave filter (11) in the first communication band signal and a signal passing through the second acoustic wave filter (12) in the second communication band. That is, in the radio frequency module (1), the noise resistance of the first acoustic wave filter (11) and the second acoustic wave filter (12) is improved.

A radio frequency module (1; 1*b*) according to a fifth aspect in any one of the first to fourth aspects further includes a resin layer (68) and a second shield electrode (69). The resin layer (68) covers at least a part of the first acoustic wave filter (11) and the second acoustic wave filter (12; 12*a*, 12*b*). The second shield electrode (69) covers at least a part of the resin layer (68).

With the radio frequency modules (1; 1*b*) according to the above aspect, the second shield electrode (69) functions as an electromagnetic shielding between the first functional electrode (641A; 643A) and the second functional electrodes (641B, 641C; 643B), and the outside of the first acoustic wave filter (11) and the outside of the second acoustic wave filter (12; 12*a*, 12*b*). Thus, it is possible to improve the signal quality of a signal passing through the radio frequency module (1; 1*b*) in the first communication band signal and a signal passing through the radio frequency module (1; 1*b*) in the second communication band. That is, in the radio frequency module (1; 1*b*), the noise resistance of the first acoustic wave filter (11) and the second acoustic wave filter (12; 12*a*, 12*b*) is improved.

In a radio frequency module (1; 1*b*) according to a sixth aspect, in the fifth aspect, the fifth main surface (121) of the second acoustic wave filter (12; 12*a*, 12*b*) on an opposite side from a first acoustic wave filter (11) side is in contact with the second shield electrode (69).

With the radio frequency module (1; 1*b*) according to the above aspect, the first shield electrode (65) and the second shield electrode (69) function as an electromagnetic shielding between the second functional electrodes (641B, 641C; 643B) and the outside of the second acoustic wave filter (12; 12*a*, 12*b*). Therefore, it is possible to improve the signal quality of a signal passing through the second acoustic wave filter (12; 12*a*, 12*b*) in the second communication band. That is, in the radio frequency module (1; 1*b*), the noise resistance of the second acoustic wave filter (12; 12*a*, 12*b*) is improved.

A radio frequency module (1; 1*b*) according to a seventh aspect in any of the first to sixth aspects further includes a conductor (661, 662). The conductors (661 and 662) connect the first acoustic wave filter (11) to the second acoustic wave filter (12; 12*a*, 12*b*). The conductors (661, 662) are located between the third main surface (611A) of the first support member (61A) and the fourth main surface (611B) of the second support member (61B). The first support member (61A) further includes a via conductor (671) that penetrates the first support member (61A) in the thickness direction. The mounting board (4) includes a ground electrode. The conductors (661, 662) and the via conductor (671) are connected to the ground electrode of the mounting board (4).

With the radio frequency modules (1; 1*b*) according to the above aspect, the conductors (661, 662) and the via conductor (671) function as an electromagnetic shielding between the first functional electrodes (641A, 643A) and the outside of the first acoustic wave filter (11). Therefore, it is possible to suppress the deterioration in the signal quality of a signal passing through the radio frequency module (1) in the first communication band.

In a radio frequency module (1; 1*b*) according to an eighth aspect, in any one of the first to seventh aspects, the first acoustic wave filter (11) is a filter for a signal of a first power class. The second acoustic wave filter (12; 12*a*, 12*b*) is a filter for a signal of a second power class, which has a maximum output power higher than the first power class.

With the radio frequency module (1; 1*b*) according to the above aspect, the heat generation of the second acoustic wave filter (12) is larger than the heat generation of the first acoustic wave filter (11). On the other hand, propagation of the heat generation from the second acoustic wave filter (12; 12*a*, 12*b*) to the first acoustic wave filter (11) is prevented by the first shield electrode (65), and the heat generation is dissipated to an opposite side from the mounting board (4). Thus, it is possible to improve the heat dissipation properties of the first acoustic wave filter (11) and the second acoustic wave filter (12; 12*a*, 12*b*).

In a radio frequency module (1; 1*b*) according to a ninth aspect, in any one of the first to eighth aspects, the first acoustic wave filter (11) is a filter for Band 39 of the 3GPP LTE standard, and the second acoustic wave filter (12; 12*a*, 12*b*) is a filter for Band 41 of the 3GPP LTE standard.

With the radio frequency module (1; 1*b*) according to the above aspect, TDD asynchronous communication using Band 39 and Band 41 of the 3GPP LTE standard is possible.

A communication device (10) according to a tenth aspect includes the radio frequency module (1; 1*b*) according to any one of the first to ninth aspects, and a signal processing circuit (2). The signal processing circuit (2) is connected to the radio frequency module (1; 1*b*).

With the communication device (10) according to the above aspect, in the radio frequency module (1; 1*b*), the first shield electrode (65) functions as an electromagnetic shielding between the first functional electrode (641A; 643A) and the second functional electrodes (641B, 641C; 643B). Thus, during asynchronous communication in TDD, it is possible to improve the isolation between the first acoustic wave filter (11) and the second acoustic wave filter (12; 12*a*, 12*b*).

REFERENCE SIGNS LIST

1, 1*b* RADIO FREQUENCY MODULE
10 COMMUNICATION DEVICE
11 FIRST FILTER (FIRST ACOUSTIC WAVE FILTER)
12 SECOND FILTER (SECOND ACOUSTIC WAVE FILTER)
12*a* SECOND TRANSMISSION FILTER (SECOND ACOUSTIC WAVE FILTER)
12*b* SECOND RECEPTION FILTER (SECOND ACOUSTIC WAVE FILTER)
121 MAIN SURFACE (FIFTH MAIN SURFACE)
13 FIRST SWITCH
130 COMMON TERMINAL
131 SELECTION TERMINAL
132 SELECTION TERMINAL
14 SECOND SWITCH
140 COMMON TERMINAL
141 SELECTION TERMINAL
142 SELECTION TERMINAL
151 POWER AMPLIFIER
152 POWER AMPLIFIER
161 LOW-NOISE AMPLIFIER
162 LOW-NOISE AMPLIFIER
17 EXTERNAL CONNECTION TERMINAL
171 ANTENNA TERMINAL
172 FIRST INPUT TERMINAL
173 SECOND INPUT TERMINAL
174 FIRST OUTPUT TERMINAL
175 SECOND OUTPUT TERMINAL
18 THIRD SWITCH
180 COMMON TERMINAL
181 SELECTION TERMINAL
182 SELECTION TERMINAL
183 SELECTION TERMINAL
2 SIGNAL PROCESSING CIRCUIT
21 RF SIGNAL PROCESSING CIRCUIT
22 BASEBAND SIGNAL PROCESSING CIRCUIT
3 ANTENNA
4 MOUNTING BOARD
41 FIRST MAIN SURFACE
42 SECOND MAIN SURFACE
51, 51*a*, 51*b* FIRST ELECTRONIC COMPONENT
52 SECOND ELECTRONIC COMPONENT
53 THIRD ELECTRONIC COMPONENT
54 FOURTH ELECTRONIC COMPONENT
55 FIFTH ELECTRONIC COMPONENT
56 SIXTH ELECTRONIC COMPONENT (ELECTRONIC COMPONENT)
61A FIRST SUBSTRATE (FIRST SUPPORT MEMBER)

611A MAIN SURFACE (THIRD MAIN SURFACE)
612A MAIN SURFACE
61B SECOND SUBSTRATE (SECOND SUPPORT MEMBER)
611B MAIN SURFACE (FOURTH MAIN SURFACE)
612B MAIN SURFACE
62A FIRST LOW ACOUSTIC VELOCITY FILM
62B SECOND LOW ACOUSTIC VELOCITY FILM
63A FIRST PIEZOELECTRIC LAYER
63B SECOND PIEZOELECTRIC LAYER
641A FIRST IDT ELECTRODE (FIRST FUNCTIONAL ELECTRODE)
641B SECOND IDT ELECTRODE (SECOND FUNCTIONAL ELECTRODE)
641C THIRD IDT ELECTRODE (SECOND FUNCTIONAL ELECTRODE)
642A FIRST CIRCUIT PORTION
642B SECOND CIRCUIT PORTION
643A FIRST UPPER ELECTRODE (FIRST FUNCTIONAL ELECTRODE)
643B SECOND UPPER ELECTRODE (SECOND FUNCTIONAL ELECTRODE)
644A FIRST PIEZOELECTRIC FILM
644B SECOND PIEZOELECTRIC FILM
645A FIRST LOWER ELECTRODE
645B SECOND LOWER ELECTRODE
646A CAVITY
646B CAVITY
65 FIRST SHIELD ELECTRODE
661 CONDUCTOR
662 FRAME (CONDUCTOR)
671 VIA CONDUCTOR
672 BUMP
68 Resin Layer
69 SECOND SHIELD ELECTRODE
D1 FIRST DIRECTION
SP0 HOLLOW SPACE
SP1 FIRST SPACE
SP2 SECOND SPACE

The invention claimed is:

1. A radio frequency module comprising:
a mounting board that has a first main surface and a second main surface facing each other;
a first acoustic wave filter that is disposed at the first main surface of the mounting board;
a second acoustic wave filter that is disposed on the first acoustic wave filter; and
a first shield electrode,
wherein the first acoustic wave filter supports transmission or reception of a first communication band for time division duplexing (TDD),
the second acoustic wave filter supports transmission or reception of a second communication band for TDD,
a combination of the first acoustic wave filter and the second acoustic wave filter is a combination of a filter that supports transmission and a filter that supports reception,
asynchronous communication is able to be performed in the first communication band and the second communication band,
the first acoustic wave filter includes
a first support member having a third main surface, and
a first functional electrode provided at the third main surface of the first support member,
the second acoustic wave filter includes
a second support member having a fourth main surface, and
a second functional electrode provided at the fourth main surface of the second support member,
the first functional electrode and the second functional electrode are located in a hollow space formed between the first support member and the second support member in a thickness direction of the mounting board and face each other, and
the first shield electrode is located in the hollow space and covers at least one of the first functional electrode or the second functional electrode.

2. The radio frequency module according to claim 1, further comprising:
a first switch that is connected to the first acoustic wave filter; and
a second switch that is connected to the second acoustic wave filter.

3. The radio frequency module according to claim 2, further comprising:
an electronic component that is disposed at the second main surface of the mounting board,
wherein the electronic component is an IC including at least one of the first switch and the second switch.

4. The radio frequency module according to claim 3,
wherein the electronic component overlaps the first acoustic wave filter in a plan view from the thickness direction of the mounting board.

5. The radio frequency module according to claim 4, further comprising:
a resin layer that covers at least a part of the first acoustic wave filter and the second acoustic wave filter; and
a second shield electrode that covers at least a part of the resin layer.

6. The radio frequency module according to claim 5,
wherein a fifth main surface of the second acoustic wave filter on an opposite side from a first acoustic wave filter side is in contact with the second shield electrode.

7. The radio frequency module according to claim 6, further comprising:
a conductor that connects the first acoustic wave filter and the second acoustic wave filter to each other,
wherein the conductor is located between the third main surface of the first support member and the fourth main surface of the second support member,
the first support member further includes a via conductor that penetrates in a thickness direction of the first support member,
the mounting board includes a ground electrode, and
the conductor and the via conductor are connected to the ground electrode of the mounting board.

8. The radio frequency module according to claim 7,
wherein the first acoustic wave filter is a filter for a signal of a first power class, and
the second acoustic wave filter is a filter for a signal of a second power class having a maximum output power higher than the first power class.

9. The radio frequency module according to claim 8,
wherein the first acoustic wave filter is a filter for Band 39 of a 3GPP LTE standard, and the second acoustic wave filter is a filter for Band 41 of the 3GPP LTE standard.

10. A communication device comprising:
the radio frequency module according to claim 9; and
a signal processing circuit that is connected to the radio frequency module.

11. The radio frequency module according to claim 1, further comprising:
a resin layer that covers at least a part of the first acoustic wave filter and the second acoustic wave filter; and a second shield electrode that covers at least a part of the resin layer.

12. The radio frequency module according to claim 11, wherein a fifth main surface of the second acoustic wave filter on an opposite side from a first acoustic wave filter side is in contact with the second shield electrode.

13. The radio frequency module according to claim 12, further comprising:

a conductor that connects the first acoustic wave filter and the second acoustic wave filter to each other, wherein the conductor is located between the third main surface of the first support member and the fourth main surface of the second support member, the first support member further includes a via conductor that penetrates in a thickness direction of the first support member, the mounting board includes a ground electrode, and the conductor and the via conductor are connected to the ground electrode of the mounting board.

14. The radio frequency module according to claim 13, wherein the first acoustic wave filter is a filter for a signal of a first power class, and the second acoustic wave filter is a filter for a signal of a second power class having a maximum output power higher than the first power class.

15. The radio frequency module according to claim 14, wherein the first acoustic wave filter is a filter for Band 39 of a 3GPP LTE standard, and the second acoustic wave filter is a filter for Band 41 of the 3GPP LTE standard.

16. A communication device comprising:

the radio frequency module according to claim 15; and a signal processing circuit that is connected to the radio frequency module.

17. The radio frequency module according to claim 1, wherein the first acoustic wave filter is a filter for a signal of a first power class, and the second acoustic wave filter is a filter for a signal of a second power class having a maximum output power higher than the first power class.

18. The radio frequency module according to claim 2, further comprising:

a resin layer that covers at least a part of the first acoustic wave filter and the second acoustic wave filter; and a second shield electrode that covers at least a part of the resin layer.

19. The radio frequency module according to claim 18, wherein a fifth main surface of the second acoustic wave filter on an opposite side from a first acoustic wave filter side is in contact with the second shield electrode.

20. The radio frequency module according to claim 19, further comprising:

a conductor that connects the first acoustic wave filter and the second acoustic wave filter to each other, wherein the conductor is located between the third main surface of the first support member and the fourth main surface of the second support member, the first support member further includes a via conductor that penetrates in a thickness direction of the first support member, the mounting board includes a ground electrode, and the conductor and the via conductor are connected to the ground electrode of the mounting board.

* * * * *